(12) United States Patent
Ashida

(10) Patent No.: US 9,384,945 B2
(45) Date of Patent: Jul. 5, 2016

(54) AUTOMATIC MATCHING UNIT AND PLASMA PROCESSING APPARATUS

(75) Inventor: Mitsutoshi Ashida, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 545 days.

(21) Appl. No.: 13/034,331

(22) Filed: Feb. 24, 2011

(65) Prior Publication Data

US 2011/0209827 A1    Sep. 1, 2011

Related U.S. Application Data

(60) Provisional application No. 61/282,664, filed on Mar. 15, 2010.

(30) Foreign Application Priority Data

Feb. 26, 2010 (JP) .................................. 2010-042049

(51) Int. Cl.
*H01L 21/3065* (2006.01)
*H01J 37/32* (2006.01)

(52) U.S. Cl.
CPC ..... *H01J 37/32082* (2013.01); *H01J 37/32174* (2013.01); *H01J 37/32183* (2013.01)

(58) Field of Classification Search
CPC .............. H01J 37/32174; H01J 37/32183; H01J 37/32091; H01J 37/32577; H01J 37/32568; H01J 37/32064; H01J 37/32082
See application file for complete search history.

(56) References Cited

U.S. PATENT DOCUMENTS

| 5,689,215 | A | * | 11/1997 | Richardson et al. | ......... 333/17.3 |
| 5,842,154 | A | * | 11/1998 | Harnett | .................. 702/106 |
| 5,889,252 | A | * | 3/1999 | Williams et al. | ......... 219/121.54 |
| 5,929,717 | A | * | 7/1999 | Richardson et al. | ......... 333/17.3 |
| 6,876,155 | B2 | * | 4/2005 | Howald et al. | ............ 315/111.51 |
| 2003/0097984 | A1 | * | 5/2003 | Nakano et al. | ................. 118/712 |
| 2006/0220574 | A1 | * | 10/2006 | Ogawa | ..................... 315/111.21 |

FOREIGN PATENT DOCUMENTS

| JP | 10-209789 | | 8/1998 |
| JP | 2003302431 | A * | 10/2003 |
| JP | 2005167819 | A * | 6/2005 |

* cited by examiner

*Primary Examiner* — Jeffrie R Lund
*Assistant Examiner* — Yuechuan Yu
(74) *Attorney, Agent, or Firm* — Rothwell, Figg, Ernst & Manbeck, P.C.

(57) ABSTRACT

In an automatic matching unit, a controller includes a first and a second matching algorithm. The operating point $Z_p$ is moved stepwise toward the matching point $Z_s$ with a relatively large pitch by using the first matching algorithm. Further, when the operating point $Z_p$ is within the outer proximity range, the operating point $Z_p$ is moved stepwise toward the matching point $Z_s$ with a relatively small pitch by using the second matching algorithm. In the second matching algorithm, the operating point $Z_p$ is moved close to the third reference line $TC_{1S}$ or $TC_{2S}$ perpendicular to the first or second reference line $C_{1S}$ or $C_{2S}$ along, e.g., the route $Z_p(7) \rightarrow Z_p(8) \rightarrow Z_p(9)$ on the impedance coordinates. The coordinates of the operating point $Z_p(9)$ reaches an available quasi-matching point $Z_B$ extremely close to the origin O (the matching point $Z_s$).

24 Claims, 12 Drawing Sheets

AUTOMATIC MATCHING UNIT AND PLASMA PROCESSING APPARATUS

CROSS-REFERENCE TO RELATED APPLICATION

This application claims priority to Japanese Patent Application No. 2010-042049 filed on Feb. 26, 2010 and U.S. Provisional Application No. 61/282,664 filed on Mar. 15, 2010, the entire contents of which are incorporated herein by reference.

FIELD OF THE INVENTION

The present invention relates to an automatic matching unit for automatically matching an impedance between a radio frequency (RF) power supply and a load, and a plasma processing apparatus using the same.

BACKGROUND OF THE INVENTION

In a manufacturing process of a semiconductor device or a flat panel display (FPD), a plasma processing apparatus for performing etching, deposition, oxidation, sputtering or the like by using a plasma is widely used. In the plasma processing apparatus, in order to use a RF power for plasma generation, a RF power of a predetermined frequency (generally, 13.56 MHz or above) is supplied from a RF power supply unit to a RF electrode (or an antenna) provided inside or outside a chamber. Further, in order to freely control energy of ions incident to a target substrate from a plasma, a RF power of a predetermined frequency (generally, 13.56 MHz or less) is supplied from the RF power supply unit to a RF electrode of a mounting table for mounting thereon the substrate.

The RF power supply unit includes a RF power supply for outputting a RF power and a matching unit for matching an impedance of the RF power side and an impedance of a load side (electrode, plasma and chamber). The RF power supply and a transmission cable are designed to have an output resistance of about 50Ω, and the impedance in the matching unit is set or controlled such that the impedance of the load side including the matching circuit becomes about 50Ω, i.e., such that the power of the reflected wave becomes minimum.

In general, the matching unit used in the plasma processing apparatus includes a plurality of variable reactance elements, and is configured as an automatic matching unit capable of variably controlling the load impedance by selecting impedance positions or values of the variable reactance elements by a stepping motor or the like.

If the impedance of the plasma load changes due to a pressure change or the like during the plasma processing, the automatic matching unit automatically corrects the load impedance to a matching point (50Ω) by variably controlling the impedance positions of the variable reactance elements. In order to perform the automatic matching operation, the automatic matching unit is provided with a circuit for measuring a load impedance, a controller that variably controls an impedance position of each variable reactance element by a stepping motor to match the measured value of the load impedance to the matching point (50Ω), and the like.

In general, the automatic matching unit includes two variable capacitors serving as the variable reactance elements in the matching circuit, the variable capacitors being respectively connected in parallel and in series to the load with respect to the RF power supply. Here, the electrostatic capacitance of the first variable capacitor connected to the load in parallel mainly operates to variably control the absolute value of the load impedance. Meanwhile, the electrostatic capacitance of the second variable capacitor connected to the load in series mainly operates to variably control the phase of the load impedance (phase difference between RF voltage and RF current).

A conventional typical automatic matching unit obtains an absolute error and a phase error by comparing a measured phase and a measured absolute value of a load impedance obtained from an impedance measuring circuit with matching point values, i.e., a reference absolute value and a reference phase. Further, the conventional automatic matching unit varies the electrostatic capacitance (capacitance position) of the first variable capacitor such that the absolute error becomes close to zero and also varies the electrostatic capacitance (capacitance position) of the second variable capacitor such that the phase error becomes close to zero (see, e.g., Japanese Patent Application Publication No. H10-209789).

In the plasma processing apparatus, the impedance of the plasma load changes dynamically and indefinitely due to a pressure change in the chamber or the like. Therefore, the automatic matching unit needs to perform an automatic matching operation capable of responding to changes in the load impedance rapidly and accurately.

However, in the conventional automatic matching unit for orthogonally and variably controlling the first and the second capacitor such that the absolute value error and the phase error of the impedance become close to zero, the variable capacitors are separately operated to control the load impedance and, thus, it is difficult to reliably and rapidly obtain convergence to the matching point.

In other words, actually, the first variable capacitor affects the phase as well as the absolute value of the load impedance, and the second variable capacitor affects the absolute value as well as the phase of the load impedance. Therefore, if the capacitance position of the first variable capacitor is varied such that the absolute value error becomes close to zero, the operating point of the load impedance becomes close to the matching point in view of the absolute value but becomes distant from the matching point in view of the phase. Meanwhile, if the capacitance position of the second capacitor is varied such that the phase error becomes close to zero, the operating point of the load impedance becomes close to the matching point in view of the phase but becomes distant from the matching point in view of the absolute value. The above-described orthogonal automatic matching is not based on the operations of the variable capacitors and does not have an algorithm for constantly and stably converging the operating point close to the matching point. Therefore, hunting occurs, or a long period of time is required to complete the matching.

SUMMARY OF THE INVENTION

In view of the above, the present invention provides an automatic matching unit capable of effectively obtaining a substantial matching state in a short period of time without causing unnecessary speed decrease or hunting in an automatic matching operation, and a plasma processing apparatus using the same.

In accordance with a first aspect of the present invention, there is provided an automatic matching unit for automatically matching an impedance between a load and a radio frequency (RF) power supply for outputting a RF power having a predetermined frequency, the automatic matching unit including: a first variable capacitor connected in parallel to the load with respect to the RF power supply; a first stepwise capacitance varying mechanism for varying an electrostatic capacitance of the first variable capacitor in a stepwise manner; a second variable capacitor connected in series to the load with respect to the RF power supply; a second stepwise capacitance varying mechanism for varying an electrostatic capacitance of the second variable capacitor in a stepwise manner; an impedance measuring unit for measuring an absolute value and a phase of an impedance of a load seen from an output terminal of the RF power supply; and a controller for variably controlling electrostatic capacitances of the first and the second variable capacitor via the first and the second stepwise capacitance varying mechanism such that the measured absolute value and the measured phase of the load impedance obtained by the impedance measuring unit become close to a predetermined reference absolute value and a predetermined phase, respectively.

The controller includes: a first matching control unit for variably controlling at least one of the electrostatic capacitances of the first and the second variable capacitor such that an operating point indicated by coordinates of the measured absolute value and the measured phase is moved to be within a first proximity range of a matching point by using as a movement target a first reference line passing through the matching point and having a first inclination or a second reference line passing through the matching point and having a second inclination on impedance coordinates having two orthogonal axes of the absolute value and the phase of the load impedance, the first inclination corresponding to variation rates of the absolute value and the phase of the load impedance to the electrostatic capacitance of the first variable capacitor, the second inclination corresponding to variation rates of the absolute value and the phase of the load impedance to the electrostatic capacitance of the second variable capacitor; and a second matching control unit for variably controlling at least one of the electrostatic capacitances of the first and the second variable capacitors after the operating point is positioned within the first proximity range such that the operating point is moved to be within a second proximity range of the matching point on the impedance coordinates by using as a movement target a third reference line perpendicular to the first or the second reference line and passing through the matching point.

In the automatic matching unit in accordance with the first aspect, when the operating point is not within the first proximity range on the impedance coordinates, the operating point is moved stepwise with a relatively large pitch toward the matching point by the first matching control unit. On the other hand, when the operating point is within the first proximity range, the operating point is moved stepwise with a relatively small pitch toward the matching point by the second matching control unit so as to be converged within the second proximity range.

In accordance with a second aspect of the present invention, there is provided an automatic matching unit for automatically matching an impedance between a load and a RF power supply for outputting a RF power having a predetermined frequency, the automatic matching unit including: a first variable capacitor connected in parallel to the load with respect to the RF power supply; a first stepwise capacitance varying mechanism for varying an electrostatic capacitance of the first variable capacitor in a stepwise manner; a second variable capacitor connected in series to the load with respect to the RF power supply; a second stepwise capacitance varying mechanism for varying an electrostatic capacitance of the second variable capacitor in a stepwise manner; an impedance measuring unit for measuring an absolute value and a phase of an impedance of a load seen from an output terminal of the RF power supply; and a controller for variably controlling electrostatic capacitances of the first and the second variable capacitor via the first and the second stepwise capacitance varying mechanism such that the measured absolute value and the measured phase of the load impedance obtained by the impedance measuring unit become close to a predetermined reference absolute value and a predetermined phase, respectively.

The controller includes: a first matching control unit for variably controlling at least one of the electrostatic capacitances of the first and the second variable capacitors such that an operating point indicated by coordinates of the measured absolute value and the measured phase is moved close to a first reference line passing through the matching point and having a first inclination or a second reference line passing through the matching point and having a second inclination on impedance coordinates having two orthogonal axes of the absolute value and the phase of the load impedance by using as a movement target the first or the second reference line, the first inclination corresponding to variation rates of the absolute value and the phase of the load impedance to the electrostatic capacitance of the first variable capacitor, the second inclination corresponding to variation rates of the absolute value and the phase of the load impedance to the electrostatic capacitance of the second variable capacitor; and a second matching control unit for variably controlling at least one of the electrostatic capacitances of the first and the second variable capacitors after the operating point is positioned close to the first or the second reference line such that the operating point is moved close to a third reference line perpendicular to the first or the second reference line and passing through the matching point.

In the automatic matching unit in accordance with the second aspect, when the operating point is distant from the first or the second reference line on the impedance coordinates, the operating point is moved stepwise with a relatively large pitch toward the first or the second reference line by the first matching control unit. Further, when the operating point becomes close to the first or the second reference line, the operating point is moved stepwise with a relatively small pitch toward the matching point by the second matching control unit so as to be converged to a position close to the third reference line.

In accordance with a third aspect of the present invention, there is provided a plasma processing apparatus including: an evacuable processing chamber accommodating a substrate to be processed; a processing gas supply unit for supplying a desired processing gas into the processing chamber; a plasma generating unit for generating a plasma of the processing gas by a RF discharge in the processing chamber; a RF power supply for outputting a RF power having a predetermined frequency used for the RF discharge; and the automatic matching unit described above, connected between the RF power supply and the plasma generating unit.

In accordance with a fourth aspect of the present invention, there is provided a plasma processing apparatus including: an evacuable processing chamber accommodating a substrate to be processed; a processing gas supply unit for supplying a desired processing gas into the processing chamber; a plasma generating unit for generating a plasma of the processing gas in the processing chamber; an electrode for mounting thereon the substrate in the processing chamber; a RF power supply for outputting a RF power having a predetermined frequency used for controlling energy of ions incident onto the substrate on the electrode from the plasma; and the automatic matching unit described above, connected between the RF power supply and the electrode.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings which form a part hereof.

Figure 1:
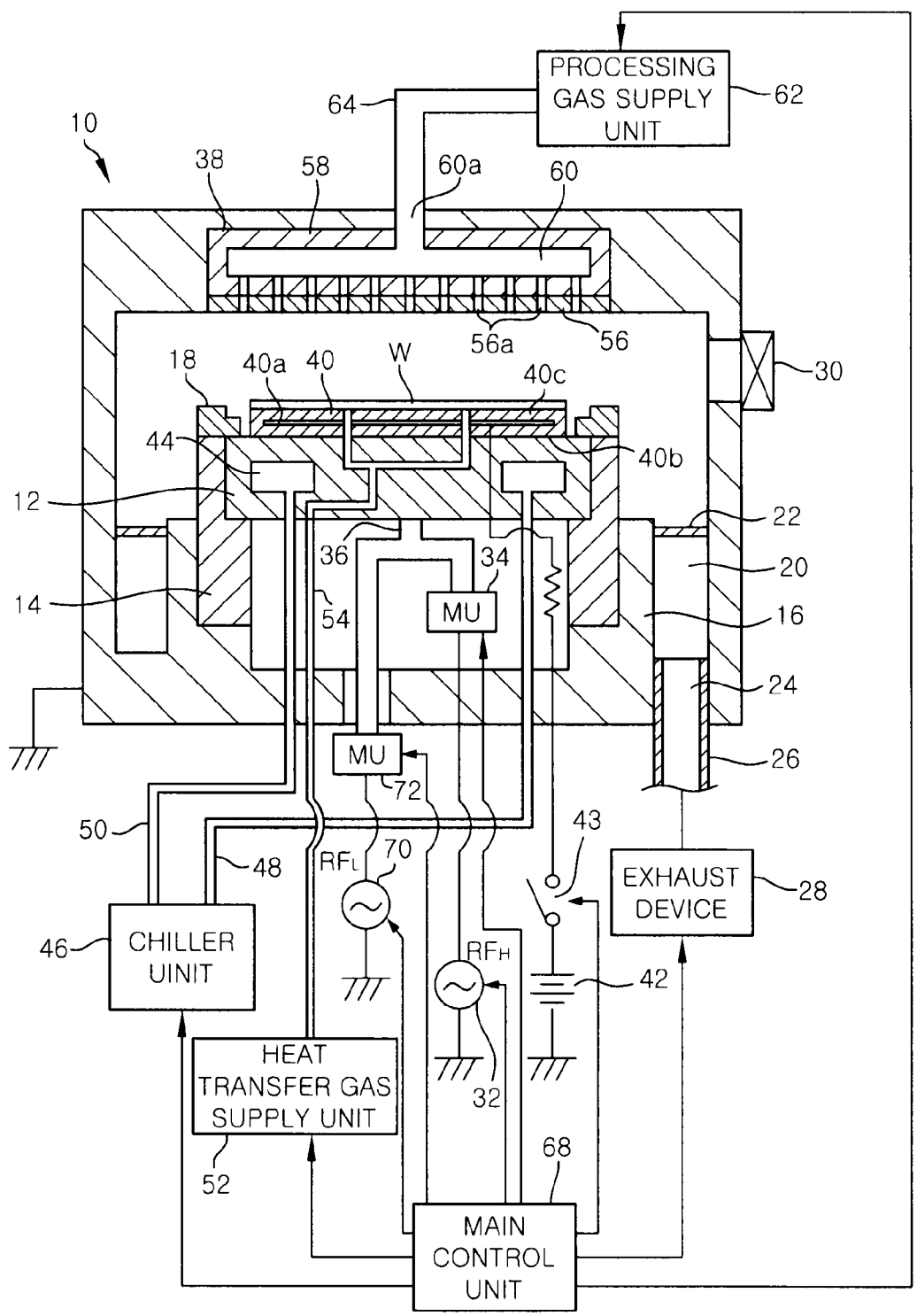
FIG. 1 is a vertical cross sectional view showing a configuration of a plasma processing apparatus in accordance with an embodiment of the present invention.

FIG. 1 shows a configuration of a plasma processing apparatus as an example to which an automatic matching unit of the present invention is applicable. This plasma processing apparatus is configured as a capacitively coupled plasma etching apparatus in which two RF powers are applied to a lower electrode, and includes a cylindrical chamber (processing chamber) 10 made of metal, e.g., aluminum, stainless steel or the like. The chamber 10 is frame grounded.

A circular plate-shaped lower electrode or susceptor 12 for mounting thereon a target substrate, e.g., a semiconductor wafer W, is provided in the chamber 10. The susceptor 12 is made of, e.g., aluminum, and is supported by an insulating cylindrical supporting portion 14 extending vertically upward from a bottom of the chamber 10. A focus ring 18 made of, e.g., quartz or silicon, is disposed on the upper surface of the cylindrical supporting portion 14 to annularly surround the top surface of the susceptor 12.

An exhaust path 20 is formed between a sidewall of the chamber 10 and the cylindrical support portion 16. An annular baffle plate 22 is attached to the entrance or the inside of the exhaust path 20, and an exhaust port 24 is provided at the bottom portion of the chamber 10. An exhaust device 28 is connected to the exhaust port 24 via an exhaust pipe 26. The exhaust device 28 includes a vacuum pump to evacuate a processing space in the chamber 10 to a predetermined vacuum level. Attached to the sidewall of the chamber 10 is a gate valve 30 for opening and closing a loading/unloading port for a semiconductor wafer W.

A first RF power supply 32 for plasma generation is electrically connected to the susceptor 12 via a first matching unit (MU) 34 and a power feed rod 36. The RF power supply 32 outputs a first RF power $RF_H$ having a predetermined frequency of, e.g., about 40 MHz, adequate to generation of a capacitively coupled plasma. The first matching unit 34 matches an impedance between the first RF power supply 32 and the load (mainly, the susceptor, the plasma, the chamber). Further, a shower head 38 to be described later is provided at a ceiling portion of the chamber 10 and serves as an upper electrode of ground potential. Accordingly, the first RF power from the first RF power supply 32 is capacitively applied between the susceptor 12 and the shower head 38.

Moreover, a second RF power supply 70 for ion attraction is electrically connected to the susceptor 12 via a second matching unit 72 and the power feed rod 36. The second RF power supply 70 outputs a second RF power $RF_L$ having a predetermined frequency of, e.g., 3.2 MHz, adequate to control energy of ions attracted toward the semiconductor wafer W on the susceptor 12. The second matching unit 72 matches an impedance between the second RF power supply 70 and the load (mainly, the susceptor, the plasma, the chamber).

An electrostatic chuck 40 is provided on an upper surface of the susceptor 12 to hold the semiconductor wafer W by an electrostatic attraction force. The electrostatic chuck 40 includes an electrode 40a made of a conductive film and a pair of insulating films 40b and 40c. The electrode 40a is interposed between the insulating films 40b and 40c. A DC power supply 42 is electrically connected to the electrode 40a via a switch 43. By applying a DC voltage from the DC power supply 42 to the DC electrode 40a, the semiconductor wafer W can be attracted to and held on the electrostatic chuck 40 by the electrostatic force.

The susceptor 12 has therein a coolant path 44 extending in, e.g., a circumferential direction. A coolant, e.g., cooling water, of a predetermined temperature flows from a chiller unit 46 via lines 48 and 50. By controlling a temperature of the coolant, it is possible to control a processing temperature of the semiconductor wafer W on the electrostatic chuck 40. Moreover, a heat transfer gas, e.g., He gas, is supplied from a heat transfer gas supply unit 52 to a gap between the top surface of the electrostatic chuck 40 and the backside of the semiconductor wafer W.

The shower plate 38 provided at the ceiling portion includes an electrode plate 56 having a plurality of gas injection holes 56a on a bottom surface thereof and an electrode holder 58 for holding the electrode plate 56 in an attachable and detachable manner. A buffer space 60 is provided in the electrode holder 58, and a gas supply line 64 from a processing gas supply unit 62 is connected to a gas inlet port 60a of the buffer space 60.

A main control unit 68 controls operations of the respective parts of the plasma etching apparatus, e.g., the exhaust device 28, the first RF power supply 32, the switch 43 for the electrostatic chuck, the chiller unit 46, the heat transfer gas supply unit 52, the processing gas supply unit 62, the second RF power supply unit 70, the second matching unit 72 and the like.

In the plasma etching apparatus, in order to perform the etching, the gate valve 30 is opened first, and a semiconductor wafer W as a target object is loaded into the chamber 10 and mounted on the electrostatic chuck 40. Then, an etching gas (e.g., a gaseous mixture) is supplied from the processing gas supply unit 62 into the chamber 10 at a predetermined flow rate and flow rate ratio. Moreover, the pressure inside the chamber 10 is adjusted to a preset level by the exhaust device 28. Further, the first RF power $RF_H$ having a preset level is supplied from the first RF power supply 32 to the susceptor 12 via the first matching unit 34 and the second RF power $RF_L$ having a preset level is supplied from the second RF power supply 70 to the susceptor via the second matching unit 72. Moreover, a heat transfer gas (He gas) is supplied from the heat transfer supply unit 52 to a contact interface between the electrostatic chuck 40 and the semiconductor wafer W. Then, a high DC voltage is applied to the DC power supply 42 to the DC electrode 40a of the electrostatic chuck 40 by turning on the switch 43, so that the heat transfer gas is confined in the contact interface by an electrostatic attraction force of the electrostatic chuck 40. The etching gas injected from the shower head 38 is converted to a plasma by a RF discharge generated between both electrodes 12 and 38. A main surface of the semiconductor W is etched by radicals and/or ions produced by the plasma.

In this plasma etching apparatus, the automatic matching unit of the present invention can be applied to any of the first matching unit 34 included in the RF power supply unit for plasma generation and the second matching unit 72 included in the RF power supply unit for ion attraction.

Therefore, the plasma etching apparatus of the present embodiment can stably and effectively generate a plasma by performing automatic matching with high speed and high accuracy by applying the automatic matching unit of the present invention to the first matching unit 34, and also can stably and effectively control ion attraction by performing automatic matching with high speed and high accuracy by applying the automatic matching unit of the present invention to the second matching unit 72.

Hereinafter, the automatic matching unit of the present invention which is applied to the first matching unit 34 or the second matching unit 72 of the plasma etching apparatus will be described with reference to FIGS. 2 to 11.

Figure 2:
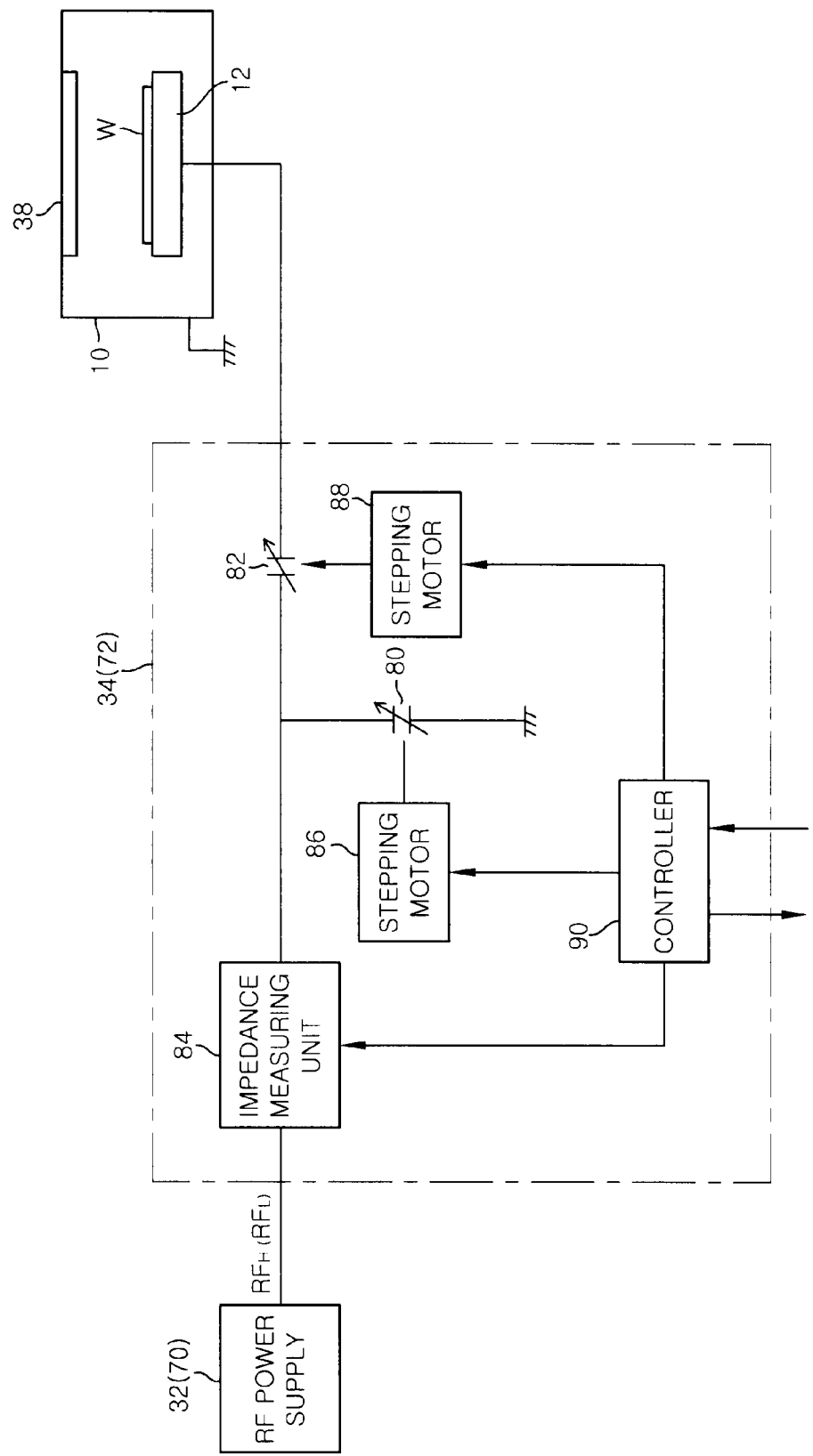
FIG. 2 is a block diagram showing configurations of principal parts of an automatic matching unit in accordance with an embodiment of the present invention which is applied to the plasma processing apparatus.

FIG. 2 shows configurations of principal parts of the automatic matching unit 34 or 72 in accordance with an embodiment of the present invention. The automatic matching unit 34 or 72 includes two variable capacitors 80 and 82 as variable reactance elements in the matching circuit. Here, the first and the second variable capacitor 80 and 82 are connected in parallel and in series to the plasma load on the side of the chamber 10 with respect to the RF power supply 32 or 70. Further, the matching circuit includes an impedance element, e.g., an inductance coil (not shown), in addition to both variable capacitors 80 and 82.

This automatic matching unit 34 or 72 has an impedance measuring unit 84, a first and a second stepping motor 86 and 88, and a controller 90 to perform the automatic matching operation.

The impedance measuring unit 84, which is provided at a front end of the matching circuit, measures an RF voltage and an RF current supplied from the RF power supply 32 or 70 to the plasma load, and calculates a measured absolute value $ZM_m$ and a measured phase $Z\theta_m$ (phase difference of the RF voltage and the RF current) of the impedance Z of the load side including the matching circuit from the measured RF voltage value and the measured RF current value.

The controller 90 is configured to variably control the electrostatic capacitances (capacitance positions) of the first and the second variable capacitor 80 and 82 in a stepwise manner through the first and the second stepping motor 86 and 88 serving as the stepwise capacitance varying mechanism such that the measured phase $Z\theta_m$ and the measured absolute value $ZM_m$ of the load impedance Z obtained by the impedance measuring unit 84 become close to the predetermined reference absolute value $ZM_s$ and the predetermined phase reference value $Z\theta_s$, respectively.

The matching point $Z_s$ in the automatic matching unit 34 or 72 is set to a resistance of about 50Ω ($Z_s$=50+j0) which is equal to the output impedance of the RF power supply 32 or 70. Therefore, $ZM_s$ is 50 and $Z\theta_s$ is 0.

The controller 90 including a microcomputer controls the entire automatic matching operation, and transmits and receives required control signals and data to and from the main control unit 68 (see FIG. 1). The automatic matching unit 34 or 72 of the present embodiment is characterized by the function of the controller 90 (particularly, control algorithm) in the automatic matching operation.

Figure 3:
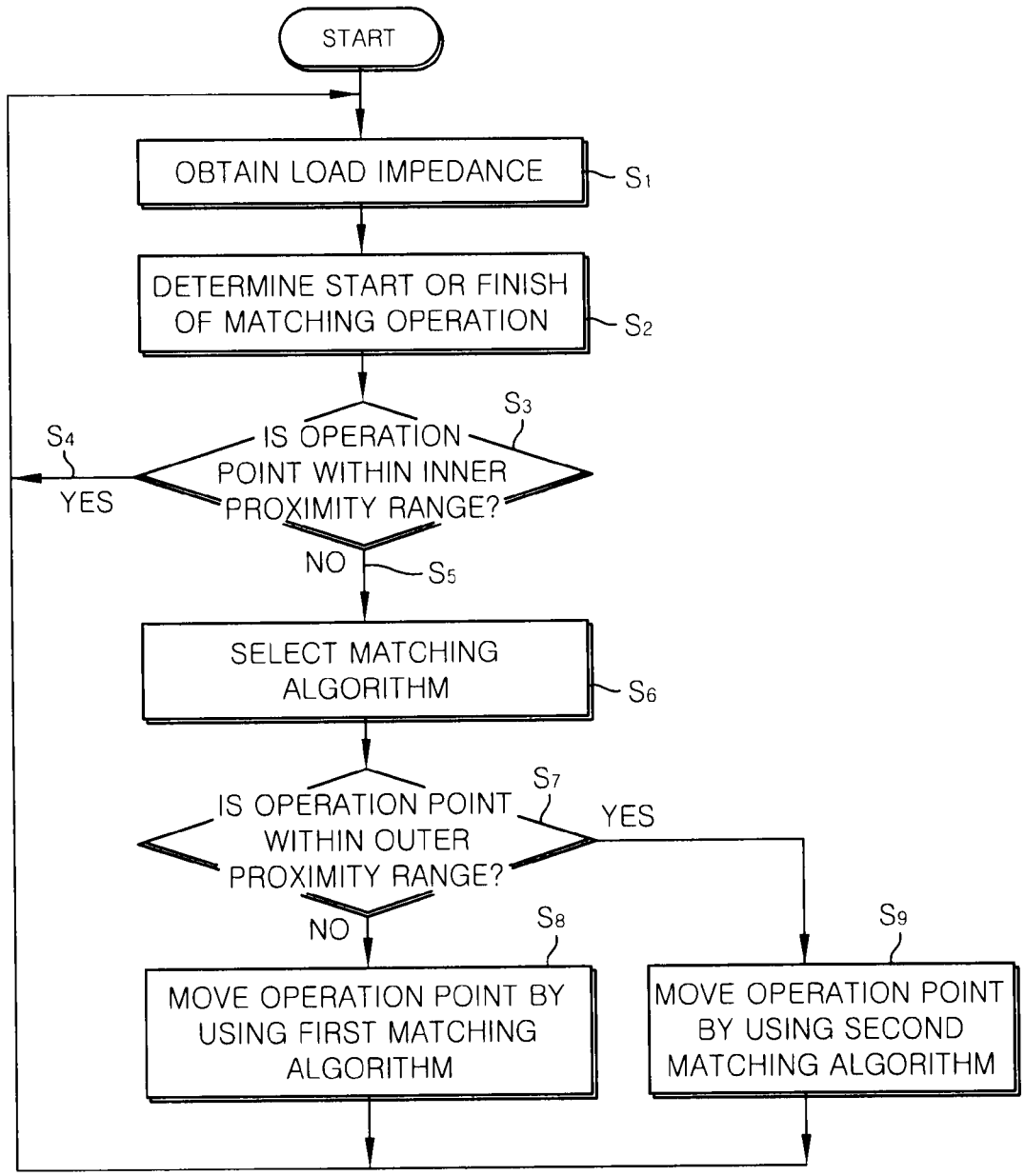
FIG. 3 is a flowchart showing a sequence of a control algorithm sequence of a controller in an automatic matching operation of the automatic matching unit.

FIG. 3 shows the sequence of the control algorithm of the controller 90 in the automatic matching operation. The automatic matching operation of the automatic matching unit 34 or 72 starts at the same time when the plasma processing of a target object or a semiconductor wafer W in the chamber 10 starts. The automatic matching operation may start or restart even during the processing if the matching becomes poor by pressure changes or external factors after the capacitance positions of the first and second variable capacitors 80 and 82 are fixed as a result of the substantial matching state.

While the automatic matching unit 34 or 72 is operating, the controller 90 obtains the measured phase $Z\theta_m$ and the measured absolute value $ZM_m$ of the load impedance from the impedance measuring unit 84 at regular cycles in accordance with the instruction from the main control unit 68 (step $S_1$).

The controller 90 can make an impedance coordinate system having two orthogonal axes of the phase $Z\theta$ and the absolute value ZM of the load impedance Z in a software manner, and can constantly detect the matching point $Z_z$ indicated by coordinates of the reference absolute value $ZM_s$ and the reference phase $Z\theta_s$ and the operating point $Z_p$ indicated by coordinates of the reference absolute value $ZM_m$ and the reference phase $Z\theta_m$ on the impedance coordinates. Here, the operating point $Z_p$ corresponds to the current electrostatic capacitances (capacitance positions) $C_1$ and $C_2$ of the first and the second variable capacitor 80 and 82.

The controller 90 determines whether or not the automatic matching operation should be started or continued (i.e., whether or not the operating point $Z_p$ should be moved) or should be finished (i.e., whether or not the operating point $Z_p$ should be fixed to the current position) based on the measured phase $Z\theta_m$ and the measured absolute value $ZM_m$ of the load impedance Z measured at regular cycles (step $S_2$). Specifically, when the operating point $Z_p$ is within the predetermined inner proximity range set near the matching point Zs, the operating point $Z_p$ is fixed to the current position (step $S_3 \rightarrow S_4$). However, when the operating point $Z_p$ is not within the inner proximity range, the process proceeds to an operation of moving the operating point $Z_p$ (step $S_3 \rightarrow S_5$).

In order to move the operating point $Z_p$, the algorithm for the operating point movement control needs to be selected or determined first (step $S_6$). In the present embodiment, the controller 90 selects one of two matching algorithms based on whether or not the operating point $Z_p$ is within the predetermined outer proximity range set near the matching point $Z_s$ (step $S_7$).

In other words, when the operating point $Z_p$ is not within the outer proximity range, the controller 90 enables the operating point $Z_p$ to be moved stepwise toward the matching point $Z_s$ with a relatively large pitch by using the first matching algorithm (first matching control unit) (step $S_8$. Further, when the operating point $Z_p$ is within the outer proximity range, the controller 90 enables the operating point $Z_p$ to be moved stepwise toward the matching point $Z_s$ with a relatively small pitch by using the second matching algorithm (second matching control unit) (step $S_9$).

Figure 4A:
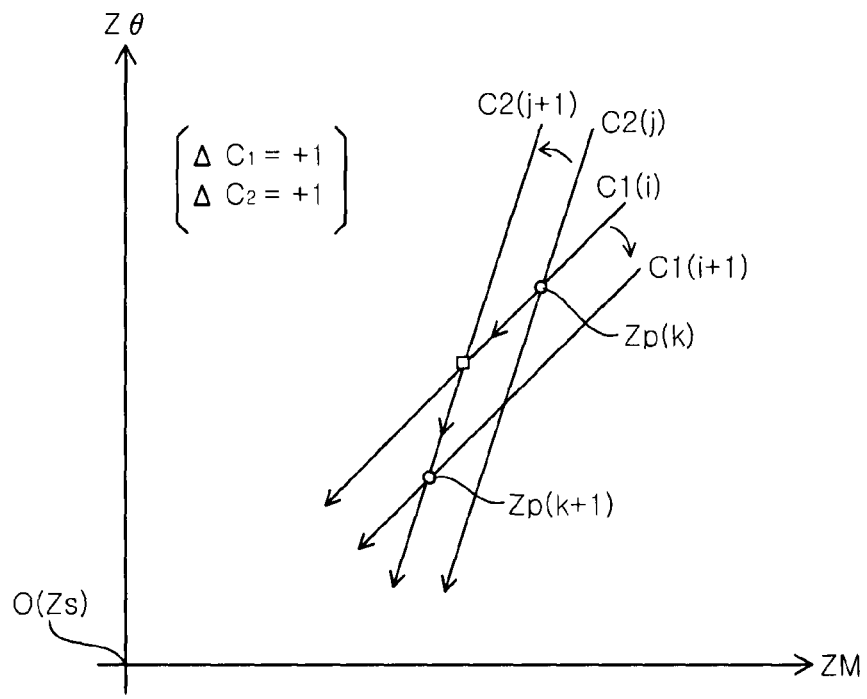
FIGS. 4A to 4D show first to fourth basic movement patterns for moving an operating point in a first matching algorithm, respectively.
Figure 4B:
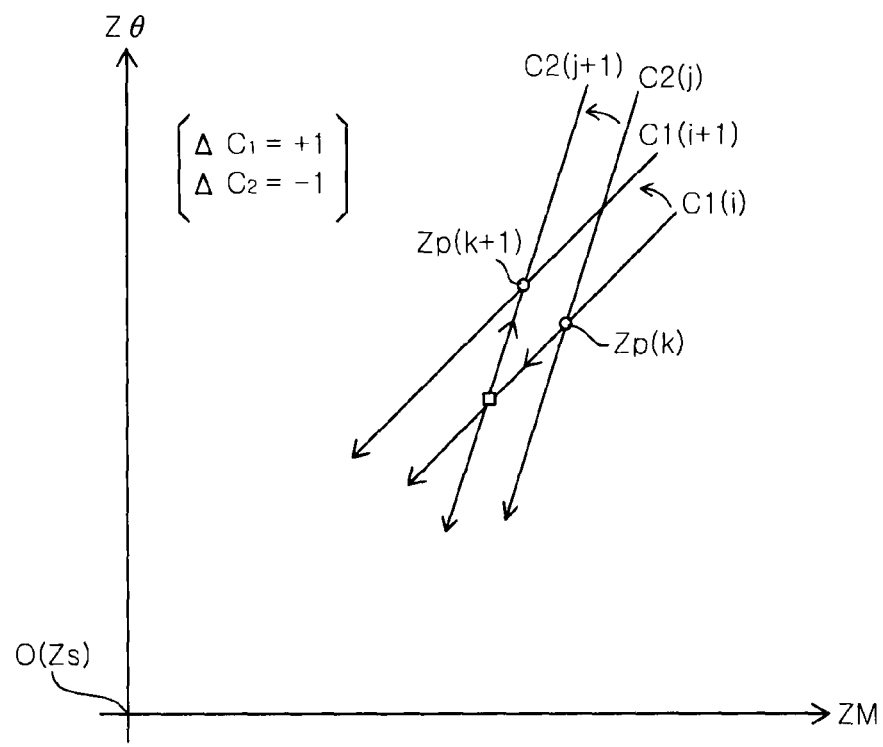
Figure 4C:
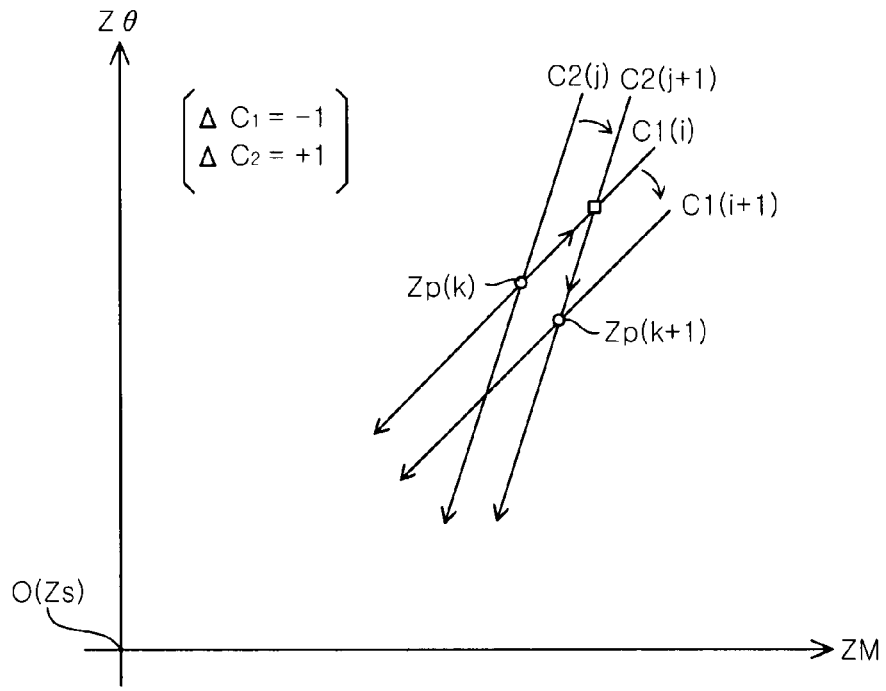
Figure 4D:
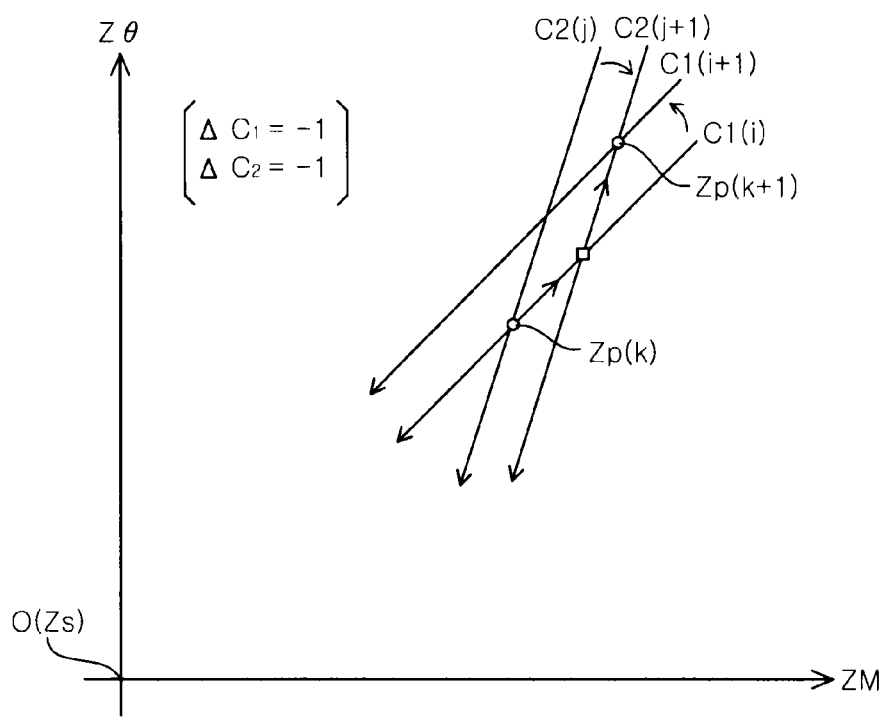
Figure 5:
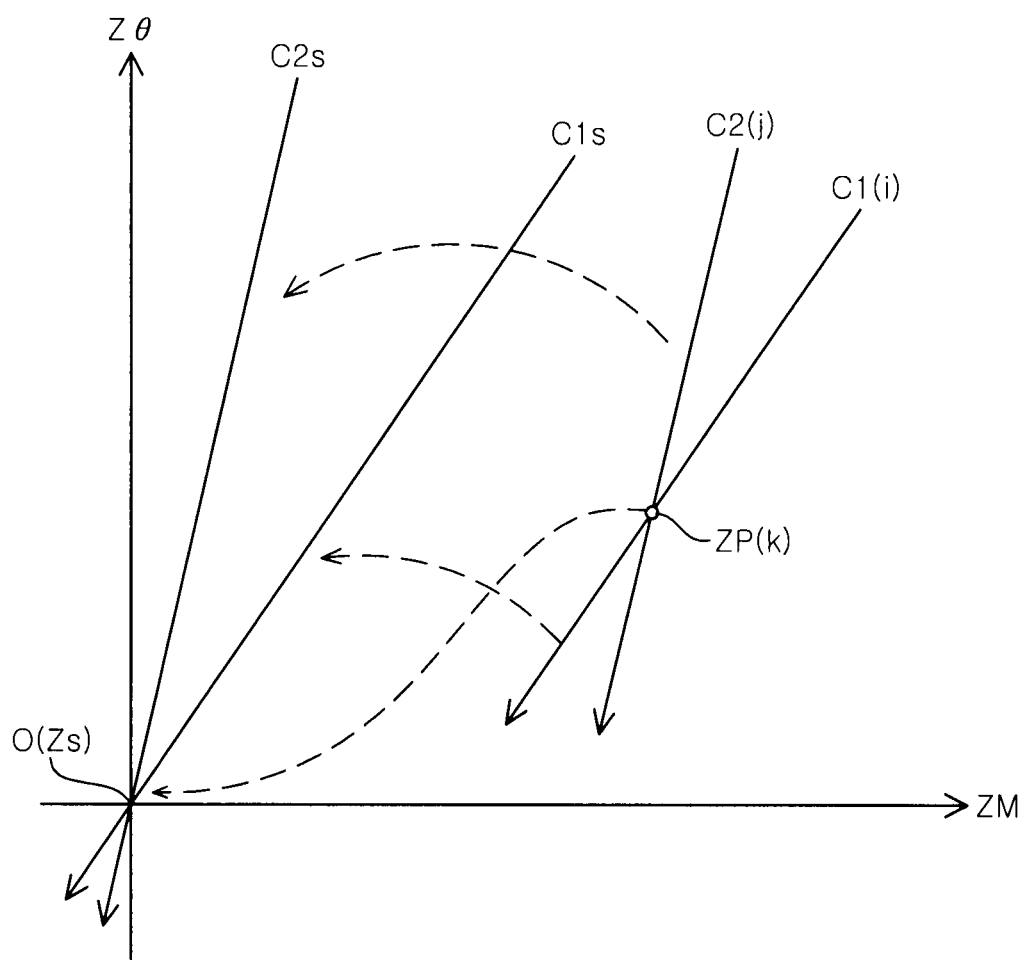
FIG. 5 schematically illustrates a method of the first matching algorithm.

FIGS. 4 and 5 explain the function of the first matching algorithm (first matching control unit) of the present embodiment.

First of all, the basic operation of moving the operating point $Z_p$ on the impedance coordinates will be described. In the present embodiment, the matching algorithm enables the phase $Z\theta$ and the absolute value $ZM$ of the load impedance $Z$ to be changed by varying the capacitance positions $C_1$ and $C_2$ of the first and the second variable capacitor 80 and 82. As an example, there are set variations $\delta ZM_1$ and $\delta Z\theta_1$ of the absolute value $ZM$ and the phase $Z\theta$ of the load impedance $Z$ in the case of varying the capacitance position $C_1$ of the first variable capacitor 80 by one step and variations $\delta ZM_2$ and $\delta Z\theta_2$ of the absolute value $ZM$ and the phase $Z\theta$ of the load impedance $Z$ in the case of varying the capacitance position $C_2$ of the second variable capacitor 82 by one step.

When the capacitance position $C_1$ of the first variable capacitor 80 is arbitrarily varied on the impedance coordinates, the operating point $Z_p$ moves on a linear line having first inclination $R_1$ ($R_1 = \delta Z\theta_1/\delta ZM_1$). When the capacitance position $C_2$ of the second variable capacitor 82 is arbitrarily varied, the operating point $Z_p$ moves on a linear line having second inclination $R_2$ ($R_2 = \delta Z\theta_2/\delta ZM_2$).

Here, when the capacitance positions $C_1$ and $C_2$ of the first and the second variable capacitor 80 and 82 are varied by one step, the operating point $Z_p$ can move on the impedance coordinates in four patterns shown in FIGS. 4A to 4D. Further, the variation of the phase $Z\theta$ and the absolute value $ZM$ of the load impedance $Z$ with respect to $C_1$ and $C_2$ is negative. In other words, when $C_1$ and $C_2$ are varied by one step (+1) in the positive direction, the operating point $Z_p$ moves in a direction that the measured absolute value $ZM_m$ and the measured phase $Z\theta_m$ are decreased. When $C_1$ and $C_2$ are varied by one step (−1) in the negative direction), the operating point $Z_p$ moves in a direction that the measured absolute value $ZM_m$ and the measured phase $Z\theta_m$ are increased. First, $C_1$ is varied by one step and, then, $C_2$ is varied by one step.

FIG. 4A shows the case of varying $C_1$ by +1 and $C_2$ by +1 ($\Delta C_1 = +1$, $\Delta C_2 = +1$). When $C_1$ is varied by +1, the $C_2$ coordinate axis is moved by one pitch from $C_2(j)$ to $C_2(j+1)$ positioned in a left upper side. When $C_2$ is varied by +1, the $C_1$ coordinate axis is moved by one pitch from $C_1(i)$ to $C_1(i+1)$ positioned in a right lower side, and the operating point moves from the intersection point $Z_p(k)$ between $C_1(i)$ and $C_2(j)$ to the intersection point $Z_p(k+1)$ between $C_1(i+1)$ and $C_2(j+1)$.

FIG. 4B shows the case of varying $C_1$ by +1 and $C_2$ by −1 ($\Delta C_1 = +1$, $\Delta C_2 = -1$). When $C_1$ is varied by +1, the $C_2$ coordinate axis is moved by one pitch from $C_2(j)$ to $C_2(j+1)$ positioned in a left upper side. When $C_2$ is varied by −1, the $C_1$ coordinate axis is moved by one pitch from $C_1(i)$ to $C_1(i+1)$ positioned in a left upper side, and the operating point moves from the intersection point $Z_p(k)$ between $C_1(i)$ and $C_2(j)$ to the intersection point $Z_p(k+1)$ between $C_1(i+1)$ and $C_2(j+1)$.

FIG. 4C shows the case of varying $C_1$ by −1 and $C_2$ by +1 ($\Delta C_1 = -1$, $\Delta C_2 = +1$). When $C_1$ is varied by −1, the $C_2$ coordinate axis is moved by one pitch from $C_2(j)$ to $C_2(j+1)$ positioned in a right lower side. When $C_2$ is varied by +1, the $C_1$ coordinate axis is moved by one pitch from $C_1(i)$ to $C_1(i+1)$ positioned in a right lower side, and the operating point moves from the intersection point $Z_p(k)$ between $C_1(i)$ and $C_2(j)$ to the intersection point between $C_1(i+1)$ and $C_2(j+1)$.

FIG. 4D shows the case of varying $C_1$ by −1 and $C_2$ by −1 ($\Delta C_1 = -1$, $\Delta C_2 = -1$). When $C_1$ is varied by −1, the $C_2$ coordinate axis is moved by one pitch from $C_2(j)$ to $C_2(j+1)$ positioned in a right lower side. When $C_2$ is varied by +1, the $C_1$ coordinate axis is moved by one pitch from $C_1(i)$ to $C_1(i+1)$ positioned in a left upper side, and the operating point moves from the intersection point $Z_p(k)$ between $C_1(i)$ and $C_2(j)$ to the intersection point between $C_1(i+1)$ and $C_2(j+1)$.

The first matching algorithm of the present embodiment uses the second pattern (FIG. 4B) among the above four basic movement patterns (FIGS. 4A to 4D) for moving the operating point $Z_p$. In other words, as shown in FIG. 5, when the $C_1$ coordinate axis and the $C_2$ coordinate axis pass through the origin O (matching point $Z_s$), the operating point $Z_p$ coincides with the matching point $Z_s$ and the complete matching state is obtained. Therefore, in the first matching algorithm, the $C_1$ coordinate axis and the $C_2$ coordinate axis passing through the origin O (matching point $Z_s$) are set as the first and the second reference line $C_{1S}$ and $C_{2S}$. Further, $C_2$ is varied by one step at regular cycles in a direction that the current $C_1$ coordinate axis $C_1(i)$ (further the operating point $Z_p$) becomes close to the first reference line $C_{1S}$, and $C_1$ is varied by one step at regular cycles in a direction that the current $C_2$ coordinate axis $C_2(j)$ (further the operating point $Z_p$) becomes close to the second reference line $C_{2S}$. To do so, it is preferable to use the second basic movement pattern ($\Delta C_1 = +1$, $\Delta C_2 = -1$) (FIG. 4B).

This basic movement pattern ($\Delta C_1 = +1$, $\Delta C_2 = -1$) uses the following calculation equations (1) and (2) as control logic.

$$\Delta C_1 = [R_2 \cdot ZM - Z\theta] = \pm 1 \quad (1)$$

$$\Delta C_2 = [-R_1 \cdot ZM + Z\theta] = \pm 1 \quad (2)$$

Figure 6A:
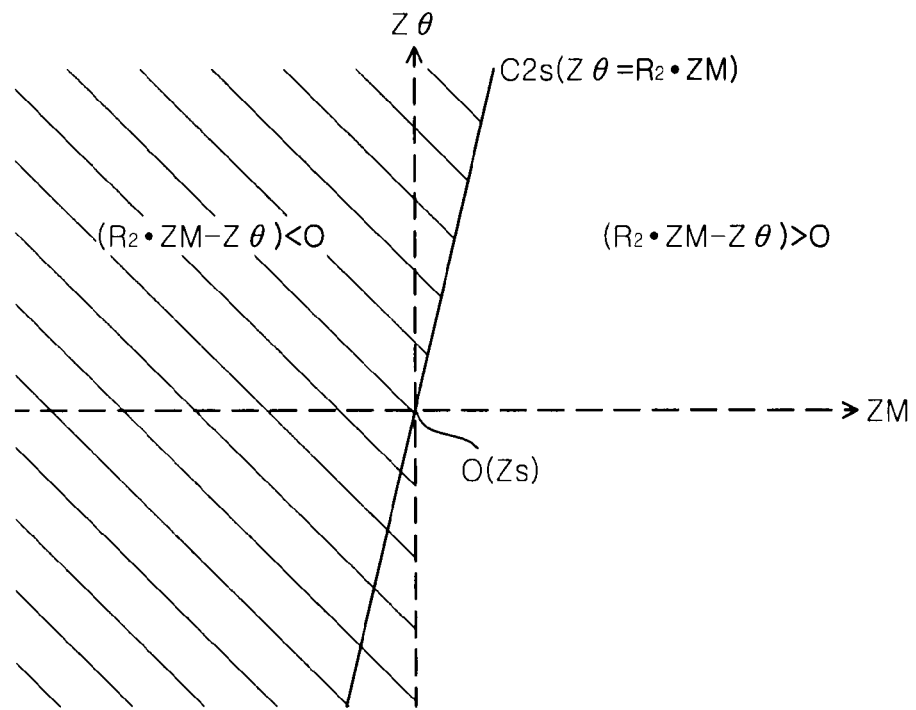
FIGS. 6A and 6B explain control logic used in the first matching algorithm by illustration.

Here, the calculation equation (1) indicates that when $R_2 \cdot ZM - Z\theta$ has a positive value, $\Delta C_1$ is varied by +1, whereas when $R_2 \cdot ZM - Z\theta$ has a negative value, $\Delta C_1$ is varied by −1. In other words, as shown in FIG. 6A, when the operating point $Z_p$ is within a right plane region between two regions (plane region/shaded region) divided by the second reference line $C_{2S}$ on the impedance coordinates, $R_2 \cdot ZM - Z\theta$ has a positive value and $\Delta C_1$ is varied by +1. On the other hand, when the operating point $Z_p$ is within the left shaded region, $R_2 \cdot ZM - Z\theta$ has a negative value and $\Delta C_1$ is varied by −1. In both cases, when $\Delta C_1$ is varied by one step, the current $C_2$ coordinate axis $C_2(j)$ is moved by one pitch toward the second reference line $C_{2S}$.

Figure 6B:
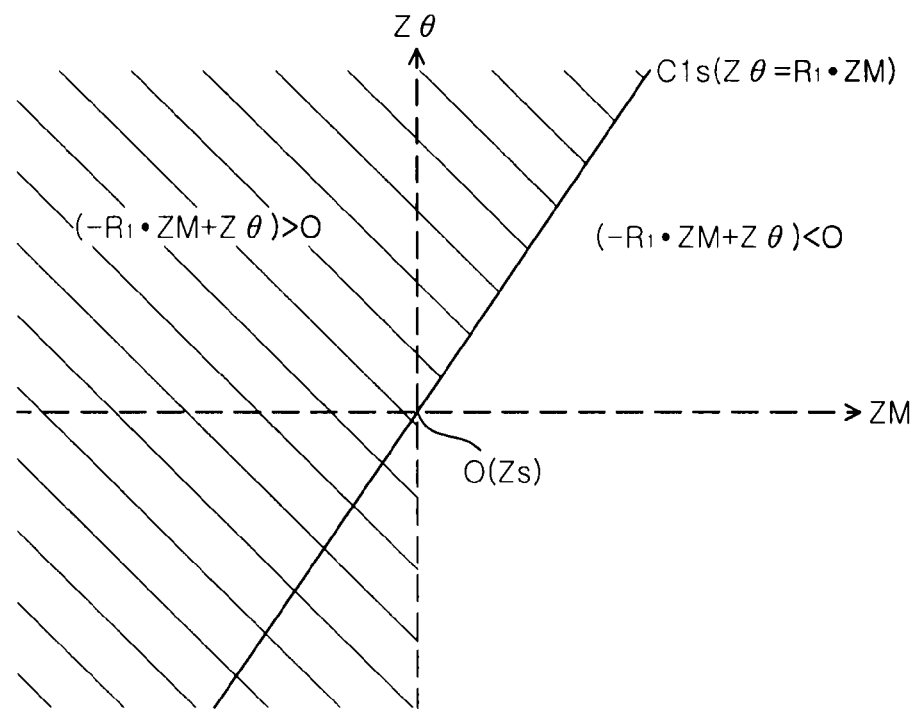

The calculation equation (2) indicates that when $-R_1 \cdot ZM + Z\theta$ has a positive value, $\Delta C_2$ is varied by +1, and whereas when $-R_1 \cdot ZM + Z\theta$ has a negative value, $\Delta C_2$ is varied by −1. In other words, as shown in FIG. 6B, when the operating point $Z_p$ is within the right plane region between two regions (plane region/shaded region) divided by the first reference line $C_{1S}$ on the impedance coordinates, $-R_2 \cdot ZM + Z\theta$ has a negative value and $\Delta C_2$ is varied by −1. On the other hand, when the operating point $Z_p$ is within the left shaded region, $-R_2 \cdot ZM + Z\theta$ has a positive value and $\Delta C_2$ is varied by +1. In both cases, when $\Delta C_2$ is varied by one step, the current $C_1$ coordinate axis $C_1(i)$ is moved by one pitch toward the first reference line $C_{1S}$.

It should be noted that the first matching algorithm enables the calculation operation and further the operating point moving operation (step $S_8$) to be performed quickly in a short period of time by using the simple calculation equations (1) and (2) without using a table.

In the above example (FIGS. 4A to 4D), it seems that the operating point $Z_p$ can be positioned close to the origin O (the matching point $Z_s$) when the basic movement pattern ($\Delta C_1 = +1$, $\Delta C_2 = +1$) of FIG. 4A is used compared to when the basic movement pattern of FIG. 4B is used. However, when the basic movement pattern of FIG. 4A is used, the $C_1$ coordinate axis $C_1(i)$ moves in a direction away from the first reference line $C_{1S}$ (to the lower left side), so that the convergence to the matching point is not achieved.

Figure 7:
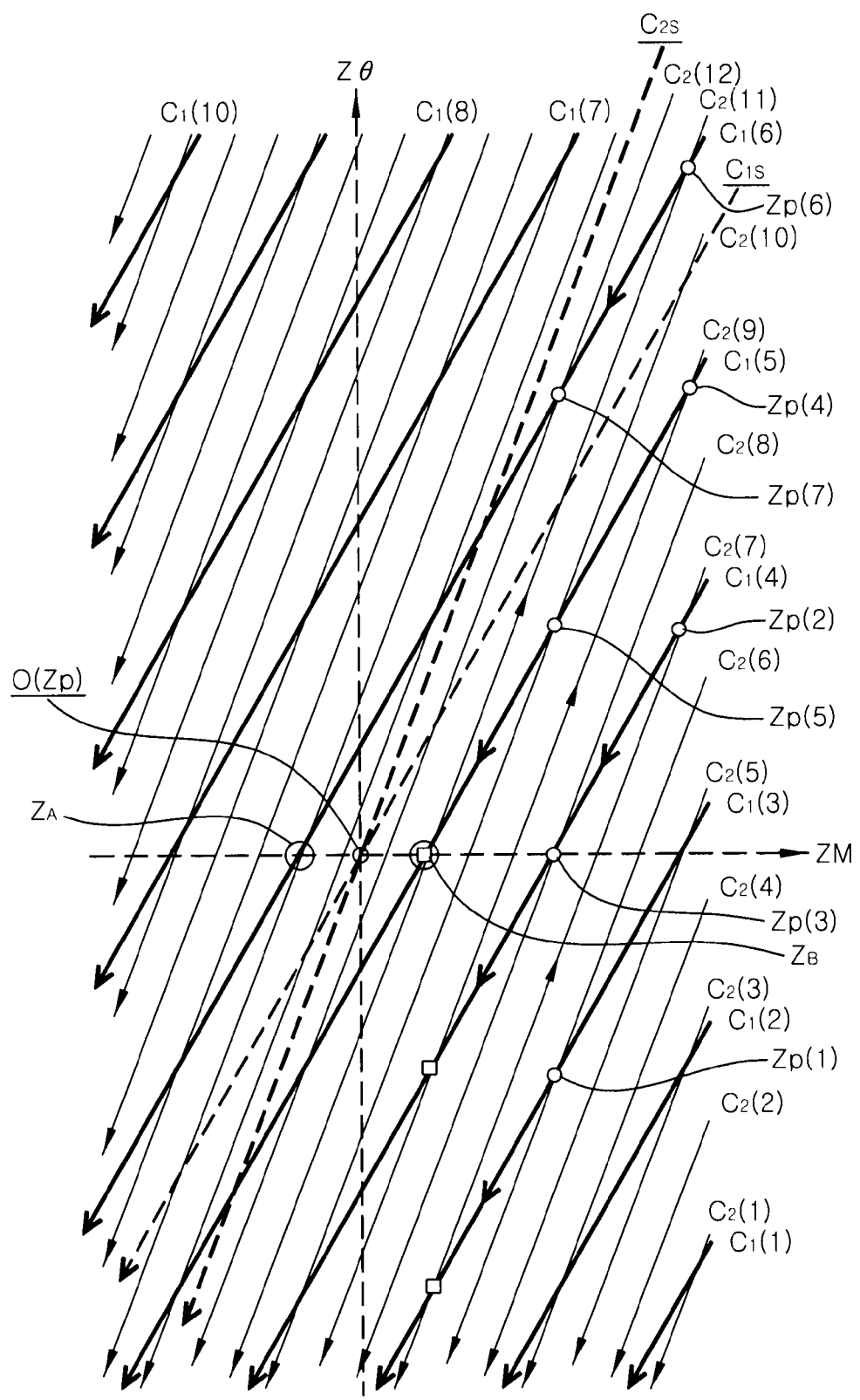
FIG. 7 explains an operation of the first matching algorithm based on a specific example.

FIG. 7 explains the process of moving the operating (step $S_8$) by using the first matching algorithm (first matching control unit) in detail based on a specific example.

In this example, the variations $\delta ZM_1$ and $\delta Z\theta_1$ of the absolute value ZM and the phase $Z\theta$ of the load impedance Z in the case of varying the capacitance position $C_1$ of the first variable capacitor 80 by one step are set to −1 and −2, respectively, and the inclination $R_1$ of the $C_1$ coordinate axis (first inclination) is set to 2. Further, the variations $\delta ZM_2$ and $\delta Z\theta_2$ of the absolute value ZM and the phase $Z\theta$ of the load impedance Z in the case of varying the capacitance position $C_2$ of the second variable capacitor 82 by one step are set to −2 and −6, respectively, and the inclination $R_2$ of the $C_2$ coordinate axis (second inclination) is set to 3.

In this case, the gap of the $C_1$ coordinate axis $C_1(i)$, $C_1(i+1)$, ... on the absolute value ZM axis and that on the phase $Z\theta$ axis are respectively 1 and 2. Meanwhile, the gap of the $C_2$ coordinate axis $C_2(j)$, $C_1(j+1)$, ... on the absolute value ZM axis and that on the phase axis $Z\theta$ are respectively ⅓ and 1. Moreover, the above calculation equations (1) and (2) are modified as follows.

$$\Delta C_1 = [3ZM - Z\theta] = \pm 1 \quad (1)'$$

$$\Delta C_2 = [-2ZM + Z\theta] = \pm 1 \quad (2)'$$

Besides, in this specific example, $C_1$ for moving the $C_2$ coordinate axis with a relatively small gap is varied by one step at each cycle and $C_2$ for moving the $C_2$ coordinate axis with a relatively large gap is varied by one step at every two cycles in order to balance the sensitivity (gain) of $\Delta C_1$ and that of $\Delta C_2$.

Referring to FIG. 7, the first operating point $Z_p(1)$ is positioned on the intersection point of the $C_1$ coordinate axis $C_1(3)$ and the $C_2$ coordinate axis $C_2(6)$, and the coordinates thereof $(ZM_m, Z\theta_m)$ are (1.5, −2).

(1) In this case, the following calculation results are obtained from the first cycle.

$$\Delta C_1 = [3 \times 1.5 - (-2)] = [6.5] > 0 \Rightarrow +1$$

$$\Delta C_2 = [-2 \times 1.5 + (-2)] = [-5] < 0 \Rightarrow -1$$

Based on the above calculation results, $\Delta C_1$ is variably controlled by +1 and $\Delta C_2$ is variably controlled by −1. As a result, the $C_2$ coordinate axis is moved from $C_2(6)$ to $C_2(7)$ adjacent thereto by one pitch in the left upper direction; the $C_1$ coordinate axis is moved from $C_1(3)$ to $C_1(4)$ adjacent thereto by one pitch in the left upper direction; and the operating point $Z_p$ is moved to the intersection point $Z_p(2)$ between $C_1(4)$ and $C_2(7)$. The coordinates $(ZM_m, Z\theta_m)$ of the operating point $Z_p(2)$ at that position are (2.5, 2).

(2) The following calculation result is obtained from the second cycle.

$$\Delta C_1 = [3 \times 2.5 - 2] = [5.5] > 0 \Rightarrow +1$$

Based on the above calculation result, $\Delta C_1$ is variably controlled by +1. As a result, the $C_2$ coordinate axis is moved from $C_2(7)$ to $C_2(8)$ adjacent thereto by one pitch in the left upper direction, and the operating point $Z_p$ is moved to the intersection point $Z_p(3)$ between $C_1(4)$ and $C_2(8)$. The coordinates $(ZM_m, Z\theta_m)$ of the operating point $Z_p(3)$ at that position are (1.5, 0).

(3) The following calculation results are obtained from the third cycle.

$$\Delta C_1 = [3 \times 1.5 - 0] = [4.5] > 0 \Rightarrow +1$$

$$\Delta C_2 = [-2 \times 1.5 + 0] = [-3] < 0 \Rightarrow -1$$

Based on the above calculation results, $\Delta C_1$ is variably controlled by +1 and $\Delta C_2$ is variably controlled by −1. As a result, the $C_2$ coordinate axis is moved from $C_2(8)$ to $C_2(9)$ adjacent thereto by one pitch in the left upper direction; the $C_1$ coordinate axis is moved from $C_1(4)$ to $C_1(5)$ adjacent thereto by one pitch in the left upper direction; and, and the operating point $Z_p$ is moved to the intersection point $Z_p(4)$ between $C_1(5)$ and $C_2(9)$. The coordinates $(ZM_m, Z\theta_m)$ of the operating point $Z_p(4)$ at that position are (2.5, 4).

(4) The following calculation result is obtained from the fourth cycle.

$$\Delta C_1 = [3 \times 2.5 - 4] = [3.5] > 0 \Rightarrow +1$$

Based on the above calculation result, $\Delta C_1$ is variably controlled by +1. As a result, the $C_2$ axis is moved from $C_2(9)$ to $C_2(10)$ adjacent thereto by one pitch in the left upper direction, and the operating point $Z_p$ is moved to the intersection point $Z_p(5)$ between $C_1(5)$ and $C_2(10)$. The coordinates $(ZM_m, Z\theta_m)$ of the operating point $Z_p(5)$ at that position are (1.5, 2).

(5) The following calculation results are obtained from the fifth cycle.

$$\Delta C_1 = [3 \times 1.5 - 2] = [2.5] > 0 \Rightarrow +1$$

$$\Delta C_2 = [-2 \times 1.5 + 2] = [-1] < 0 \Rightarrow -1$$

Based on the above calculation results, $\Delta C_1$ is variably controlled by +1 $\Delta C_2$ is variably controlled by −1. As a result, the $C_2$ coordinate axis is moved from $C_2(10)$ to $C_2(11)$ adjacent thereto by one pitch in the left upper direction; the $C_1$ coordinate axis is moved from $C_1(5)$ to $C_1(6)$ adjacent thereto by one pitch in the left upper direction; and, and the operating point $Z_p$ is moved to the intersection point $Z_p(6)$ between $C_1(6)$ and $C_2(11)$. The coordinates $(ZM_m, Z\theta_m)$ of the operating point $Z_p(6)$ at that position are (2.5, 6).

(6) The following calculation result is obtained from the sixth cycle.

$$\Delta C_1 = [3 \times 2.5 - 6] = [1.5] > 0 \Rightarrow +1$$

Based on the above calculation result, $\Delta C_1$ is variably controlled by +1. As a result, the $C_2$ coordinate axis is moved from $C_2(11)$ to $C_2(12)$ adjacent thereto by one pitch in the left upper direction, and the operating point $Z_p$ is moved to the intersection point $Z_p(7)$ between $C_1(6)$ and $C_2(12)$. The coordinates $(ZM_m, Z\theta_m)$ of the operating point $Z_p(7)$ at that position are (1.5, 4).

By repeating the aforementioned operating point movement (step $S_8$) using the first matching algorithm (first matching control unit) at regular cycles, the $C_1$ coordinate axis becomes close to the first reference line $C_{1S}$ ($C_1(3) \rightarrow C_1(4) \rightarrow C_1(5) \rightarrow C_1(6)$), and the $C_2$ coordinate axis becomes close to the second reference line $C_{2S}$ ($C_2(6) \rightarrow C_2(7) \rightarrow C_2(8) \rightarrow C_2(9) \rightarrow C_2(10) \rightarrow C_2(11) \rightarrow C_2(12)$). Further, the operating point $Z_p$ becomes close to the origin O (the matching point $Z_s$) in a zigzag direction ($Z_p(1) \rightarrow Z_p(2) \rightarrow Z_p(3) \rightarrow Z_p(4) \rightarrow Z_p(5) \rightarrow Z_p(6) \rightarrow Z_p(7)$).

Figure 8:
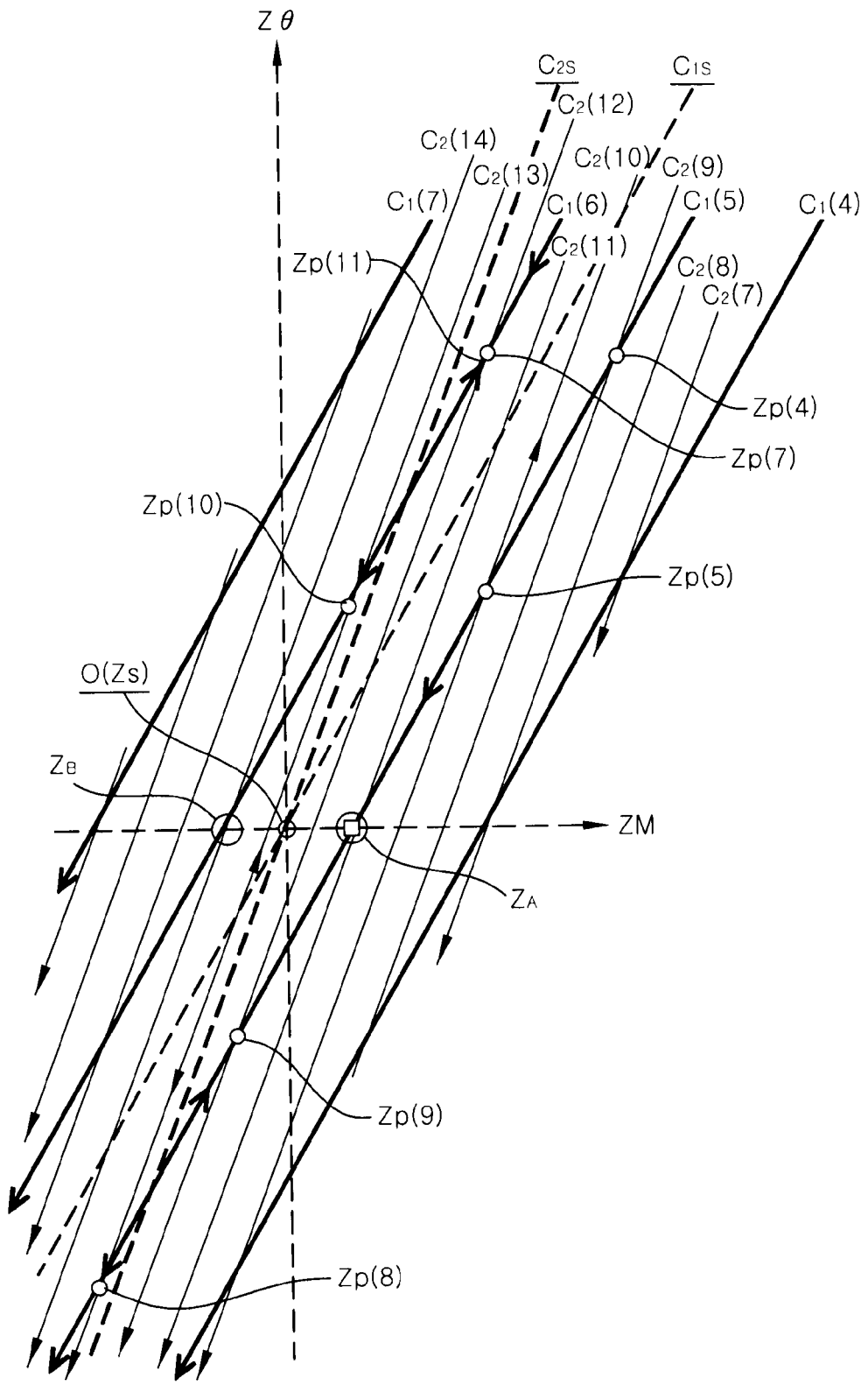
FIG. 8 explains problems generated in the case of unnecessarily continuously using the first matching algorithm.

However, if the first matching algorithm (the first matching control unit) is continuously used, the operating point $Z_p$ cannot be converged near the origin O (the matching point $Z_s$), as can be seen from FIG. 8.

(7) In other words, in accordance with the first matching algorithm (the first matching control unit), the following calculation results are obtained from the seventh cycle.

$$\Delta C_1 = [3 \times 1.5 - 4] = [0.5] > 0 \Rightarrow +1$$

$$\Delta C_2 = [-2 \times 1.5 + 4] = [1] > 0 \Rightarrow +1$$

Based on the above calculation results, $\Delta C_1$ is variably controlled by +1 and $\Delta C_2$ is variably controlled by −1. As a result, the $C_2$ coordinate axis is moved from $C_2(12)$ to $C_2(13)$ adjacent thereto by one pitch in the left upper direction; the $C_1$ coordinate axis is moved from $C_1(6)$ to $C_1(5)$ adjacent thereto by one pitch in the right lower direction; and the operating point $Z_p$ is moved to the intersection point $Z_p(8)$ between $C_1(5)$ and $C_2(13)$. The coordinates $(ZM_m, Z\theta_m)$ of the operating point $Z_p(8)$ at that position are $(-1.5, -4)$.

(8) The following calculation result is obtained from the eighth cycle.

$$\Delta C_1 = [3 \times (-1.5) - (-4)] = [-0.5] < 0 \Rightarrow -1$$

Based on the above calculation result, $\Delta C_1$ is variably controlled by +1. As a result, the $C_2$ coordinate axis is moved from $C_2(13)$ to $C_2(12)$ adjacent thereto by one pitch in the right lower direction, and the operating point $Z_p$ is moved to the intersection point $Z_p(9)$ between $C_1(5)$ and $C_2(12)$. The coordinates $(ZM_m, Z\theta_m)$ of the operating point $Z_p(9)$ at that position are $(-0.5, -2)$.

(9) The following calculation results are obtained from the ninth cycle.

$$\Delta C_1 = [3 \times (-0.5) - (-2)] = [0.5] > 0 \Rightarrow +1$$

$$\Delta C_2 = [-2 \times (-0.5) + (-2)] = [-1] < 0 \Rightarrow -1$$

Based on the above calculation results, $\Delta C_1$ is variably controlled by +1 and $\Delta C_2$ is variably controlled by −1. As a result, the $C_2$ coordinate axis is moved from $C_2(12)$ to $C_2(13)$ adjacent thereto by one pitch in the left upper direction; the $C_1$ coordinate axis is moved from $C_1(5)$ to $C_1(6)$ adjacent thereto by one pitch in the left upper direction; and the operating point $Z_p$ is moved to the intersection point $Z_p(10)$ between $C_1(6)$ and $C_2(13)$. The coordinates $(ZM_m, Z\theta_m)$ of the operating point $Z_p(8)$ at that position are $(0.5, 2)$.

(10) The following calculation result is obtained from the tenth cycle.

$$\Delta C_1 = [3 \times 0.5 - 2] = [-0.5] < 0 \Rightarrow -1$$

Based on the above calculation result, $\Delta C_1$ is variably controlled by −1. As a result, the $C_2$ coordinate axis is moved from $C_2(13)$ to $C_2(12)$ adjacent thereto by one pitch in the right lower direction, and the operating point $Z_p$ is moved to the intersection point $Z_p(11)$ between $C_1(6)$ and $C_2(12)$. The coordinates $(ZM_m, Z\theta_m)$ of the operating point $Z_p(11)$ at that position are $(1.5, 4)$ which correspond to those of the operating point $Z_p(7)$ in the sixth cycle.

As described above, if the first matching algorithm (the first matching control unit) is continuously used, the operating point $Z_p$ freely moves along the route $(Z_p(7) \rightarrow Z_p(8) \rightarrow Z_p(9) \rightarrow Z_p(10) \rightarrow Z_p(11))$ without becoming close to the origin O (the matching point $Z_s$).

In this specific example, the $C_1$ coordinate axis moved by the step variation of $C_2$ and the $C_2$ coordinate axis moved by the step variation of $C_1$ pass over the origin O (the matching point $Z_s$) without being overlapped with the first and the second reference line $C_{1S}$ and $C_{2S}$. Therefore, the operating point $Z_p$ cannot coincide with the origin O (the matching point $Z_s$) completely. In other words, the perfect matching state cannot be obtained.

However, the intersection point $Z_A$ (0.5, 0) between $C_1(5)$ on the $C_1$ coordinate axis and $C_2(11)$ on the $C_2$ coordinate axis and the intersection point $Z_S$ (−0.5, 0) between $C_1(6)$ on the $C_1$ coordinate axis and $C_2(14)$ on the $C_2$ coordinate axis are extremely close to the origin O (the matching point $Z_s$). The operating point $Z_p$ can be converged to any one of the intersection points $Z_A$ and $Z_B$ (within the operation range of the automatic matching unit), so that the state (the substantial matching state) equivalent to the perfect matching state can be obtained. In other words, in this specific example, when the operating point $Z_p$ is close to or within the inner proximity range of the origin O (the matching point $Z_s$), the operating point $Z_p$ reaches either $Z_A$ or $Z_B$.

In the present embodiment, when the controller 90 detects that the operating point $Z_p$ moves along the aforementioned route by the matching algorithm selecting process (step $S_6$), it is determined that the operating point $Z_p$ is within the preset outer proximity range (step $S_7$), and the first matching algorithm (the first matching control unit) is switched to the second matching algorithm (the second matching control unit) (step $S_7 \rightarrow S_9$).

Figure 9A:
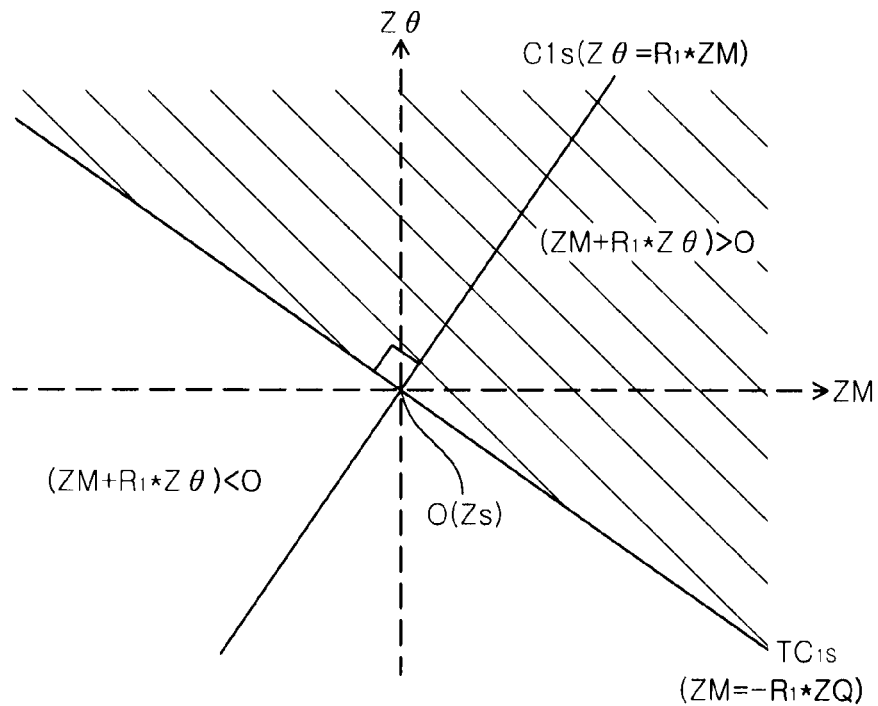
FIGS. 9A and 9B explain control logic used in a second matching algorithm by illustration.

Hereinafter, the function of the second matching algorithm (second matching control unit) of the present embodiment will be described with reference to FIGS. 9A to 10.

In the second matching algorithm, third reference lines $TC_{1S}$ and $TC_{2S}$ perpendicular to the first and the second reference line $C_{1S}$ and $C_{2S}$, respectively, are defined on the impedance coordinates, and the operating point $Z_p$ is moved on the $C_1$ coordinate axis or the $C_2$ coordinate axis toward the reference line $TC_{1S}$ or $TC_{2S}$.

For example, when the operating point $Z_p$ is moved on the $C_1$ coordinate axis toward the reference line $TC_{1S}$, the following calculation equation (3) is used.

$$\Delta C_1 = [ZM + R_1 \cdot Z\theta] = \pm 1 \qquad (3)$$

Here, the above calculation equation (3) indicates that when $ZM + R_1 \cdot Z\theta$ has a positive value, $\Delta C_1$ is varied by +1, whereas when $ZM + R_1 \cdot Z\theta$ has a negative value, $\Delta C_1$ is varied by −1. In other words, as shown in FIG. 9A, when the operating point $Z_p$ is within a right shaded region between two regions (plane region/shaded region) divided by the reference line $TC_{1S}$ on the impedance coordinates, $ZM + R_1 \cdot Z\theta$ has a positive value and $\Delta C_1$ is varied by +1. On the other hand, when the operating point $Z_p$ is within the left plane region, $ZM + R_1 Z\theta$ has a negative value and $\Delta C_1$ is varied by −1.

Moreover, when the operating point $Z_p$ is moved on the $C_2$ coordinate axis toward the reference line $TC_{2S}$, the following calculation equation (4) is used.

$$\Delta C_2 = [ZM + R_2 \cdot Z\theta] = \pm 1 \qquad (4)$$

Figure 9B:
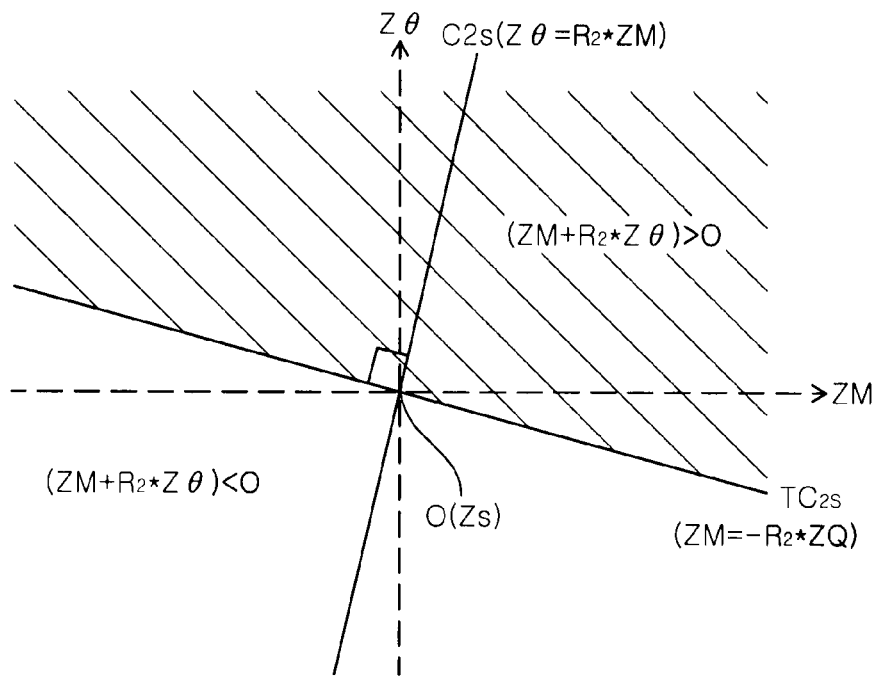

Here, the above calculation equation (4) indicates that when $ZM + R_2 Z\theta$ has a positive value, $\Delta C_2$ is varied by +1, whereas when $ZM + R_2 Z\theta$ has a negative value, $\Delta C_2$ is varied by −1. In other words, as shown in FIG. 9B, when the operating point $Z_p$ is within a right shaded region between two regions (plane region/shaded region) divided by the reference line $TC_{2S}$ on the impedance coordinates, $ZM + R_2 Z\theta$ has a positive value and $\Delta C_2$ is varied by +1. On the other hand, when the operating point $Z_p$ is within the left plane region, $ZM + R_2 Z\theta$ has a negative value and $\Delta C_2$ is varied by −1.

In the above example (FIG. 7), the moving distance of the operating point $Z_p$ per one step is smaller on the $C_1$ coordinate axis than on the $C_2$ coordinate axis. Therefore, it is preferable to use the logic in which the reference line $TC_{1S}$ perpendicular to the $C_1$ coordinate axis is set as a movement target position.

In the seventh cycle executed immediately after the operating point $Z_p$ is moved to the intersection point $Z_p(7)$ between $C_1(6)$ and $C_2(12)$, the following calculation result is obtained by the second matching algorithm. Further, the coordinates $(ZM_m, Z\theta_m)$ of the operating point $Z_p(7)$ are $(1.5, 4)$.

$$\Delta C_1 = [1.5 + 2 \times 4] = [9.5] > 0 \Rightarrow +1$$

Based on the above calculation result, $\Delta C_1$ is variably controlled by +1. As a result, as shown in FIG. 10, the $C_2$ coordinate axis is moved from $C_2(12)$ to $C_2(13)$ adjacent thereto by one pitch in the left upper direction, and the operating point $Z_p$ is moved to the intersection point $Z_p(8)$ between $C_1(6)$ and $C_2(13)$. The coordinates $(ZM_m, Z\theta_m)$ of the operating point $Z_p(8)$ at that position are $(0.5, 2)$.

Further, the following calculation result is obtained from the eighth cycle.

$$\Delta C_1 = [0.5 + 2 \times 2] = [4.5] > 0 \Rightarrow +1$$

Based on the above calculation result, $\Delta C_1$ is variably controlled by +1. As a result, as shown in FIG. 10, the $C_2$ coordinate axis is moved from $C_2(13)$ to $C_2(14)$ adjacent thereto by one pitch in the left upper direction, and the operating point $Z_p$ is moved to the intersection point $Z_p(9)$ between $C_1(6)$ and $C_2(14)$. The coordinates $(ZM_m, Z\theta_m)$ of the operating point $Z_p(9)$ at that position are $(-0.5, 0)$. In other words, the operating point reaches an available quasi-matching point $Z_B$ extremely close to the origin O (the matching point $Z_s$).

In the second matching algorithm, the calculation operation and further the operating point moving operation (step $S_9$) can be performed quickly in a short period of time by the simple calculation equations (3) and (4) without using a table.

In the present embodiment, when the controller 90 detects that the operating point $Z_p$ has reached the convergence point $Z_B$ by the matching operation completion determining process (step $S_2$), it is determined that the operating point $Z_p$ is within the preset inner proximity range (step $S_3$). Hence, the operation of the second matching algorithm (second matching control unit) is stopped, and the operating point $Z_p$ becomes stable at the convergence point $Z_B$ (step $S_3 \rightarrow S_4$). In this manner, the current automatic matching operation is completed.

Thereafter, the controller 90 acquires the measured absolute value $ZM_m$ and the measured phase $Z\theta_m$ of the load impedance Z from the impedance measuring unit 84 at regular cycles, and constantly monitors the relative position relationship or the distance relationship of the operating point $Z_p$ to the matching point $Z_s$.

If the impedance of the plasma load is changed due to pressure changes in the chamber 10 or external factors, the impedance coordinates are changed. Thus, despite that the automatic matching operation is stopped, the operating point $Z_p$ is instantly moved from the matching point $Z_s$ to a distant position on the impedance coordinates, and a poor matching state is obtained.

If the controller 90 detects the poor matching state, the automatic matching operation is restarted (step $S_3 \rightarrow S_5$). Further, the first matching algorithm (the first matching control unit) and the second matching algorithm (the second matching control unit) are sequentially operated in the above-described manner. As a consequence, the operating point $Z_p$ is converged within the predetermined inner proximity range, and the substantial matching state can be obtained in a short period of time.

Figure 10:
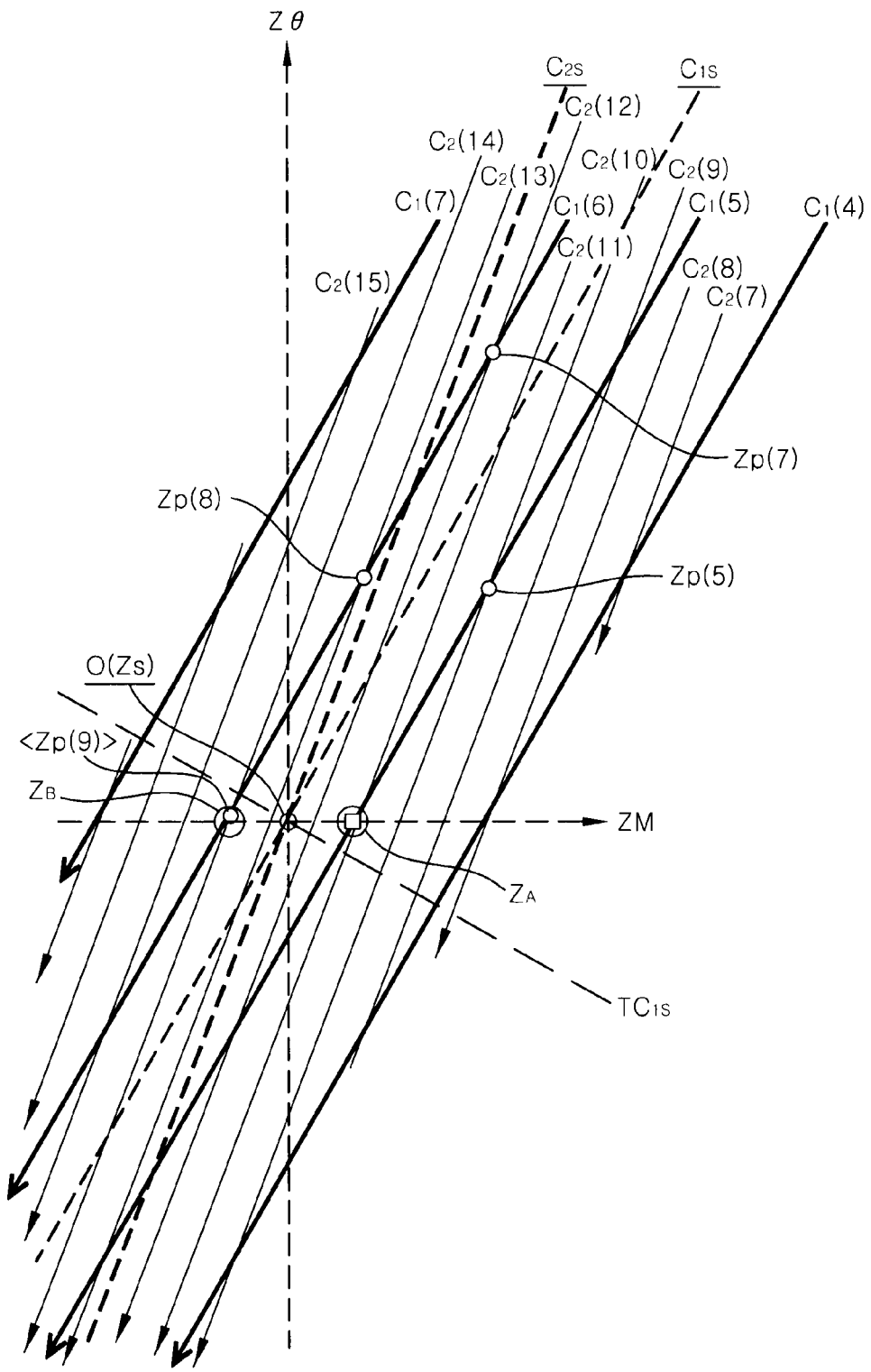
FIG. 10 explains an operation of the second matching algorithm.

In the example of FIG. 10, the calculation equation (3) is used because the reference line $TC_{1S}$ perpendicular to the $C_1$ coordinate axis is set as a movement target location in the second matching algorithm. However, the calculation equation (4) can be used when the reference line $TC_{2S}$ perpendicular to the $C_2$ coordinate axis is set as a movement target location in accordance with predetermined conditions or circumstances.

Moreover, the inner proximity range for terminating the second matching algorithm may be arbitrarily set in consideration of speed or accuracy of automatic matching, step widths of the variable capacitors 80 and 82, a variation rate and the like. For example, the inner proximity range may be set as a circle having the origin (the matching point $Z_p$) and a radius (or a diameter) obtained by multiplying a predetermined coefficient by a reference value, i.e., a pitch width of the $C_1$ coordinate axis or the $C_2$ coordinate axis or a gap on the ZM axis or the $Z\theta$ axis.

When the operating point $Z_p$ is moved under the second matching algorithm, the distance between the coordinates $(ZM_m, Z\theta_m)$ of each position and the origin O (the matching point $Z_p$) is calculated. Whenever the operating point $Z_p$ is moved in a stepwise manner, the distance continues to decrease but starts to increase at a certain point. The convergence point to which the operating point $Z_p$ is converged can be set to the coordinates of the point right before the point at which the distance starts to continue. In this case, the coordinates of the convergence point can be considered to be within the inner proximity range.

Or, when the operating point $Z_p$ is moved under the second matching algorithm, the distance between the operating point $Z_p$ and the reference line $TC_{1S}$ ($TC_{2S}$) is calculated. The convergence point can be set to the coordinates $(ZM_m, Z\theta_m)$ of the operating point $Z_p$ separated from the reference line $TC_{1S}$ ($TC_{2S}$) by a minimum distance.

In the same manner, the outer proximity range for terminating the first matching algorithm may be arbitrarily set in consideration of speed or accuracy of automatic matching, step widths of the variable capacitors 80 and 82, a variation rate and the like. In the present invention, it is important to switch the first matching algorithm and the second matching algorithm in a stepwise manner. However, the timing for switching the first matching algorithm to the second matching algorithm is not important.

In the above example (FIG. 7), once the operating point $Z_p$ moves along the circulation route ($Z_p(7) \rightarrow Z_p(8) \rightarrow Z_p(9) \rightarrow Z_p(10) \rightarrow Z_p(11)$), the operating point $Z_p$ can reach the substantial quasi-matching points $Z_A$ and $Z_B$ under the second matching algorithm.

Figure 11:
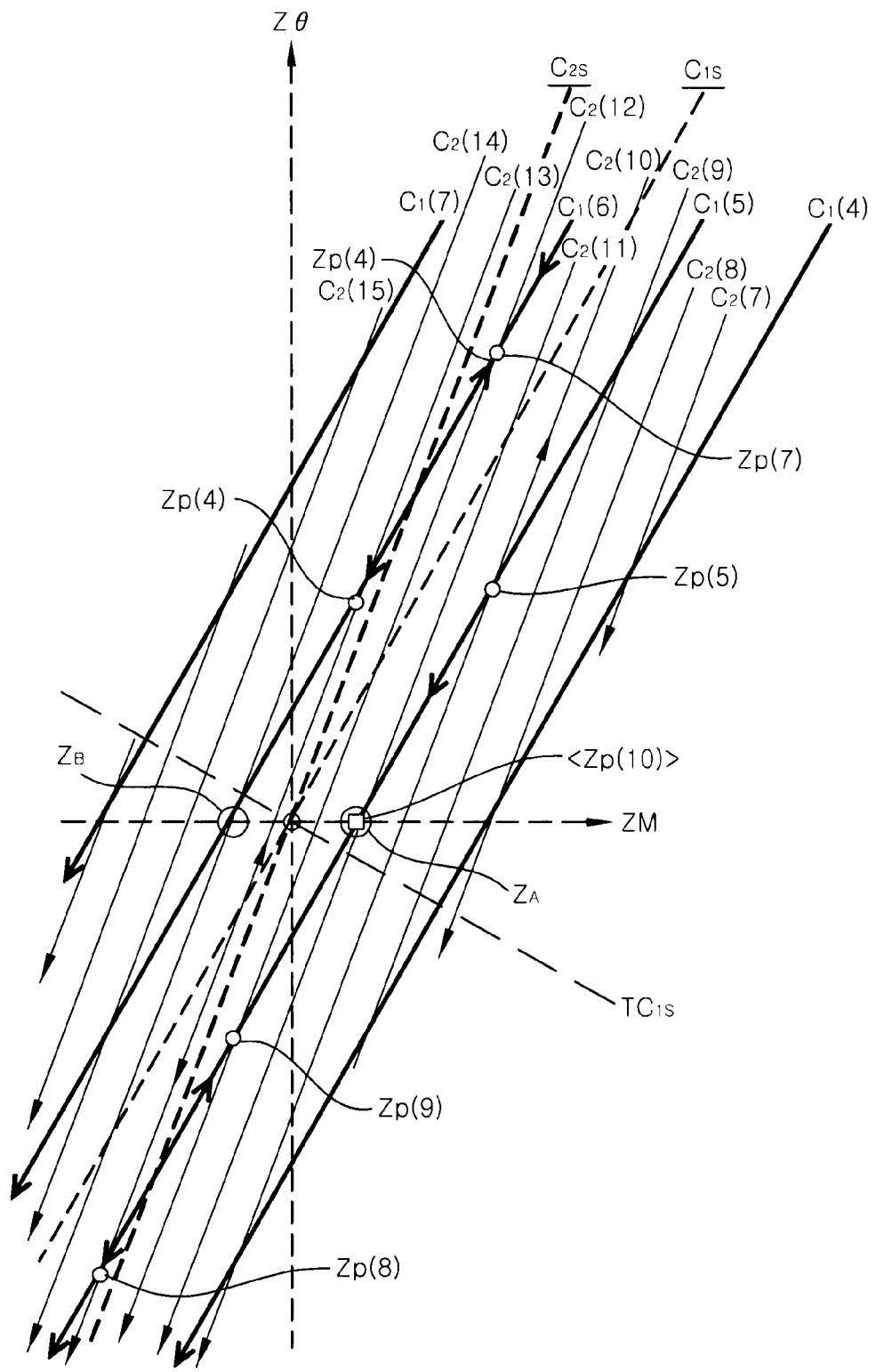
FIG. 11 explains an operation of the second matching algorithm (modification).

For example, if the first matching algorithm is switched to the second matching algorithm when the operating point $Z_p$ is moved to the intersection point $Z_p(8)$ between $C_1(5)$ and $C_2(13)$ under the first matching algorithm as shown in FIG. 11, the following calculation result is obtained from the eighth cycle. Further, the coordinates $(ZM_m, Z\theta_m)$ of the operating point $Z_p(8)$ are $(-1.5, -4)$.

$$\Delta C_1 = [-1.5 + 2 \times (-4)] = [-9.5] < 0 \Rightarrow -1$$

Based on the above calculation result, $\Delta C_1$ is variably controlled by -1. As a result, as shown in FIG. 11, the $C_2$ coordinate axis is moved from $C_2(13)$ to $C_2(12)$ adjacent thereto by one pitch in the right lower direction, and the operating point $Z_p$ is moved to the intersection point $Z_p(9)$ between $C_1(5)$ and $C_2(12)$. The coordinates $(ZM_m, Z\theta_m)$ of the operating point $Z_p(9)$ at that position are $(-0.5, -2)$.

The following calculation result is obtained from the ninth cycle.

$$\Delta C_1 = [-0.5 + 2 \times (-2)] = [-4.5] < 0 \Rightarrow -1$$

Based on the above calculation result, $\Delta C_1$ is variably controlled by -1. As a result, as shown in FIG. 11, the $C_2$ coordinate axis is moved from $C_2(12)$ to $C_2(11)$ adjacent thereto by one pitch in the right lower direction, and the operating point $Z_p$ is moved to the intersection point $Z_p(10)$ between $C_1(5)$ and $C_2(11)$. The coordinates $(ZM_m, Z\theta_m)$ of the operating point $Z_p(10)$ at that position are $(0.5, 0)$. In other words, the operating point reaches an available quasi-matching point $Z_B$ closest to the origin O (the matching point $Z_s$).

Whether or not the operating point $Z_p$ is within the outer proximity range can be determined based on various criteria such as the distance between the origin O (the matching point $Z_s$) and the operating point $Z_p$, the distance or the position relationship between the reference line $C_{1S}$ ($C_{2S}$) and the operating point $Z_p$, and the like. For example, in the above example (FIG. 7), when the operating point $Z_p$ is located on the $C_1$ coordinate axes $C_1(5)$ and $C_1(6)$ close to the reference line $C_{1S}$ even if it is located out of the aforementioned route, it may be considered that the operating point $Z_p$ is within the outer proximity range. In that case, the first matching algorithm can be switched to the second matching algorithm when the operating point $Z_p$ reaches $Z_p(4)$, $Z_p(5)$ or $Z_p(6)$. Or, if the difference between the moving distance per one step on the $C_1$ coordinate axis and that on the $C_2$ coordinate axis is obtained, the outer proximity range can be approximately set by switching the first matching algorithm to the second matching algorithm and relatively frequently moving the operating point with a small moving distance as in the methods of FIGS. 10 and 11.

Although it is not illustrated, the controller 90 can vary the first and the second inclination $R_1$ and $R_2$, and the inner and the outer proximity range in accordance with the capacitance positions $C_1$ and $C_2$ by using the mechanism for feedbacking the capacitance positions $C_1$ and $C_2$ of the first and the second variable capacitors 80 and 82 to the controller 90.

In accordance with the automatic matching unit of the present embodiment, due to the above-described configuration and operation, a substantial matching state can be effectively obtained in a short period of time without causing unnecessary speed decrease or hunting in the automatic matching operation.

Further, in accordance with the plasma processing apparatus of the present embodiment, the automatic matching unit of the present invention can improve a function of generating a plasma by using a RF power or a function of controlling ion attraction, and further can improve an apparatus performance.

In the plasma processing apparatus of the above-described embodiments, the first RF power for plasma generation and the second RF power for ion attraction are applied to the susceptor 12. However, although it is not shown, the plasma processing apparatus may be of a type in which only the RF power for plasma generation is applied to the lower electrode. Or, although it is not shown, the plasma processing apparatus may be of a type in which the RF power for plasma generation is applied to the upper electrode. In that case, the RF power for ion attraction may be applied to the lower electrode.

In the above-described embodiments, there has been described a capacitively coupled plasma processing apparatus for generating a plasma by a RF discharge between parallel plate electrodes in a chamber. However, the present invention can also be applied to an inductively coupled plasma processing apparatus for generating a plasma under an electromagnetic field by providing an antenna on top of or around the chamber, a microwave plasma processing apparatus for generating a plasma by using microwaves, or the like.

The present invention is not limited to the plasma etching apparatus, and can also by applied to other plasma processing apparatuses for performing plasma CVD, plasma oxidation, plasma nitriding, sputtering and the like. Further, a substrate to be processed is not limited to a semiconductor wafer, and can also be various substrates for used in a flat panel display, a photomask, a CD substrate, a printed circuit board and the like.

While the invention has been shown and described with respect to the embodiments, it will be understood by those skilled in the art that various changes and modification may be made without departing from the scope of the invention as defined in the following claims.

What is claimed is:

1. An automatic matching unit for automatically matching an impedance between a load and a radio frequency (RF) power supply for outputting a RF power having a predetermined frequency, the automatic matching unit comprising:
a first variable capacitor connected in parallel to the load with respect to the RF power supply;
a first stepwise capacitance varying mechanism configured to vary an electrostatic capacitance of the first variable capacitor in a stepwise manner;
a second variable capacitor connected in series to the load with respect to the RF power supply;
a second stepwise capacitance varying mechanism configured to vary an electrostatic capacitance of the second variable capacitor in a stepwise manner;
an impedance measuring unit configured to measure an absolute value and a phase of an impedance of a load seen from an output terminal of the RF power supply; and
a controller configured to variably control electrostatic capacitances of the first variable capacitor and the second variable capacitor via the first stepwise capacitance varying mechanism and the second stepwise capacitance varying mechanism such that the measured absolute value and the measured phase of the load impedance obtained by the impedance measuring unit become close to a predetermined reference absolute value and a predetermined phase, respectively,
wherein the controller includes:
a first matching control unit configured to variably control at least one of the electrostatic capacitances of the first variable capacitor and the second variable capacitor such that an operating point indicated by impedance coordinates representing the measured absolute value and the measured phase is moved to be within a first proximity range of a matching point, wherein said moving uses as a movement target a first reference line passing through the matching point and having a first inclination or uses a second reference line passing through the matching point and having a second inclination, wherein the first reference line is formed in a coordinate system having one orthogonal axis representing absolute value of the load impedance and another orthogonal axis representing phase of the load impedance, wherein the first inclination is defined with respect to the coordinate system, wherein the second reference line is formed in the coordinate system and wherein the second inclination is defined with respect to the coordinate system, the first inclination corresponding to variation rates of the absolute value of the load impedance and the phase of the load impedance in relation to the electrostatic capacitance of the first variable capacitor, the second inclination corresponding to variation rates of the absolute value of the load impedance and the phase of the load impedance in relation to the electrostatic capacitance of the second variable capacitor; and
a second matching control unit configured to variably control at least one of the electrostatic capacitances of the first variable capacitor and the second variable capacitor after the operating point is positioned within the first proximity range, wherein the second matching control unit is configured to move the operating point to be within a second proximity range of the matching point with respect to the impedance coordinates by using as a movement target a third reference line that is formed in the coordinate system and that is perpendicular to the first reference line or to the second reference line with respect to the coordinate system and that passes through the matching point.

2. The automatic matching unit of claim 1, wherein at least one of the first and the second proximity range is varied in accordance with a predetermined condition.

3. The automatic matching unit of claim 2, wherein at least one of the first and the second proximity range is varied in accordance with the electrostatic capacitances of the first variable capacitor and the second variable capacitor.

4. The automatic matching unit of claim 1, wherein the first matching control unit is configured to determine a position of the operating point between two regions divided by the first reference line on the impedance coordinates at every first cycle, and is configured to increase or decrease the electrostatic capacitance of the second variable capacitor by one step based on a determination result.

5. The automatic matching unit of claim 1, wherein the first matching control unit is configured to determine a position of the operating point between two regions divided by the second reference line on the impedance coordinates at every second cycle, and is configured to increase or decrease the electrostatic capacitance of the first variable capacitor by one step based on a determination result.

6. The automatic matching unit of claim 1, wherein the second matching control unit is configured to determine a position of the operating point between two regions divided by the third reference line on the impedance coordinates at every third cycle, and is configured to increase or decrease the electrostatic capacitance of the first or the second variable capacitor by one step based on a determination result.

7. The automatic matching unit of claim 1, wherein the controller is configured to vary the variation rates of the absolute value and the phase of the load impedance in accordance with the electrostatic capacitances of the first variable capacitor and the second variable capacitor.

8. The automatic matching unit of claim 1, wherein the controller is configured to constantly monitor a position of the operating point on the impedance coordinates even when operations of the first and the second matching control unit are stopped after a substantial matching state is obtained, and to restart the operations of the first and/or the second matching control unit when a poor matching state is detected.

9. The automatic matching unit of claim 1, wherein the first and the second stepwise capacitance varying mechanism have a first and a second stepping motor, respectively.

10. The automatic matching unit of claim 1, wherein the impedance measuring unit is configured to measure the absolute value and the phase at predetermined cycles.

11. The automatic matching unit of claim 1 wherein the first reference line is represented by an equation $Z_\theta = R_1 Z_M$ and the second reference line is represented by an equation $Z_\theta = R_2 Z_M$, wherein $Z_\theta$ represents the phase of the load impedance, $Z_M$ represents the absolute value of the load impedance, $R_1$ represents the first inclination, and $R_2$ represents the second inclination, wherein the first matching control unit is configured to:
determine whether to increase the electrostatic capacitance or decrease the electrostatic capacitance of the first variable capacitor based on whether the operating point is in a region of the coordinate system that is to the left of the second reference line or whether the operating point is in a region of the coordinate system that is to the right of the second reference line, and determine whether to increase the electrostatic capacitance or decrease the electrostatic capacitance of the second variable capacitor based on whether the operating point is in a region of the coordinate system that is to the left of the first reference line or whether the operating point is in a region of the coordinate system that is to the right of the first reference line.

12. An automatic matching unit for automatically matching an impedance between a load and a RF power supply for outputting a RF power having a predetermined frequency, the automatic matching unit comprising:
a first variable capacitor connected in parallel to the load with respect to the RF power supply;
a first stepwise capacitance varying mechanism configured to vary an electrostatic capacitance of the first variable capacitor in a stepwise manner;
a second variable capacitor connected in series to the load with respect to the RF power supply;
a second stepwise capacitance varying mechanism configured to vary an electrostatic capacitance of the second variable capacitor in a stepwise manner;
an impedance measuring unit configured to measure an absolute value and a phase of an impedance of a load seen from an output terminal of the RF power supply; and
a controller configured to variably control electrostatic capacitances of the first variable capacitor and the second variable capacitor via the first stepwise capacitance varying mechanism and the second stepwise capacitance varying mechanism such that the measured absolute value and the measured phase of the load impedance obtained by the impedance measuring unit become close to a predetermined reference absolute value and a predetermined phase, respectively,
wherein the controller includes:
a first matching control unit configured to variably control at least one of the electrostatic capacitances of the first variable capacitor and the second variable capacitor such that an operating point indicated by impedance coordinates representing the measured absolute value and the measured phase is moved close to a first reference line or a second reference line, wherein the first reference line and the second reference line are both formed in a coordinate system having one orthogonal axis representing absolute value of the load impedance and another orthogonal axis representing phase of the load impedance, the first reference line passing through a matching point and having a first inclination defined with respect to the coordinate system, the second reference line passing through the matching point and having a second inclination defined with respect to the coordinate system, wherein the first matching control unit is configured to move the operating point by using as a movement target the first or the second reference line, the first inclination corresponding to variation rates of the absolute value of the load impedance and the phase of the load impedance in relation to the electrostatic capacitance of the first variable capacitor, the second inclination corresponding to variation rates of the absolute value of the load impedance and the phase of the load impedance in relation to the electrostatic capacitance of the second variable capacitor; and a second matching control unit configured to variably control at least one of the electrostatic capacitances of the first variable capacitor and the second variable capacitor after the operating point is positioned close to the first reference line or the second reference line, wherein the second matching control unit is configured to move the operating point close to a third reference line that is formed in the coordinate system and that is perpendicular to the first or to the second reference line with respect to the coordinate system and that passes through the matching point.

13. The automatic matching unit of claim 12, wherein the first matching control unit is configured to determine a position of the operating point between two regions divided by the first reference line on the impedance coordinates at every first cycle, and is configured to increase or decrease the electrostatic capacitance of the second variable capacitor by one step based on a determination result.

14. The automatic matching unit of claim 12, wherein the first matching control unit is configured to determine a position of the operating point between two regions divided by the second reference line on the impedance coordinates at every second cycle, and is configured to increase or decrease the electrostatic capacitance of the first variable capacitor by one step based on a determination result.

15. The automatic matching unit of claim 12, wherein the second matching control unit is configured to determine a position of the operating point between two regions divided by the third reference line on the impedance coordinates at every third cycle, and is configured to increase or decrease the electrostatic capacitance of the first or the second variable capacitor by one step based on a determination result.

16. The automatic matching unit of claim 12, wherein the controller is configured to vary the variation rates of the absolute value and the phase of the load impedance in accordance with the electrostatic capacitances of the first variable capacitor and the second variable capacitor.

17. The automatic matching unit of claim 12, wherein the controller is configured to constantly monitor a position of the operating point on the impedance coordinates even when operations of the first and the second matching control unit are stopped after a substantial matching state is obtained, and to restart the operations of the first and/or the second matching control unit when a poor matching state a detected.

18. The automatic matching unit of claim 12, wherein the first and the second stepwise capacitance varying mechanism have a first and a second stepping motor, respectively.

19. The automatic matching unit of claim 12, wherein the impedance measuring unit is configured to measure the absolute value and the phase at predetermined cycles.

20. The automatic matching unit of claim 12, wherein the first reference line is represented by an equation $Z_\theta = R_1 Z_M$ and the second reference line is represented by an equation $Z_\theta = R_2 Z_M$, wherein $Z_\theta$ represents the phase of the load impedance, $Z_M$ represents the absolute value of the load impedance, $R_1$ represents the first inclination, and $R_2$ represents the second inclination, wherein the first matching control unit is configured to:

determine whether to increase the electrostatic capacitance or decrease the electrostatic capacitance of the first variable capacitor based on whether the operating point is in a region of the coordinate system that is to the left of the second reference line or whether the operating point is in a region of the coordinate system that is to the right of the second reference line, and determine whether to increase the electrostatic capacitance or decrease the electrostatic capacitance of the second variable capacitor based on whether the operating point is in a region of the coordinate system that is to the left of the first reference line or whether the operating point is in a region of the coordinate system that is to the right of the first reference line.

21. A plasma processing apparatus comprising:
an evacuable processing chamber accommodating a substrate to be processed;
a processing gas supply unit configured to supply a desired processing gas into the processing chamber;
a plasma generating unit for configured to generate a plasma of the processing gas by a RF discharge in the processing chamber;
a RF power supply configured to output a RF power having a predetermined frequency used for the RF discharge; and
the automatic matching unit described in claim 1, connected between the RF power supply and the plasma generating unit.

22. A plasma processing apparatus comprising:
an evacuable processing chamber accommodating a substrate to be processed;
a processing gas supply unit configured to supply a desired processing gas into the processing chamber;
a plasma generating unit configured to generate a plasma of the processing gas by a RF discharge in the processing chamber;
a RF power supply configured to output a RF power having a predetermined frequency used for the RF discharge; and
the automatic matching unit described in claim 12, connected between the RF power supply and the plasma generating unit.

23. A plasma processing apparatus comprising:
an evacuable processing chamber accommodating a substrate to be processed;
a processing gas supply unit configured to supply a desired processing gas into the processing chamber;
a plasma generating unit configured to generate a plasma of the processing gas in the processing chamber;
an electrode configured to mount thereon the substrate in the processing chamber;
a RF power supply configured to output a RF power having a predetermined frequency used for controlling energy of ions incident onto the substrate on the electrode from the plasma; and
the automatic matching unit described in claim 1, connected between the RF power supply and the electrode.

24. A plasma processing apparatus comprising:
an evacuable processing chamber accommodating a substrate to be processed;
a processing gas supply unit configured to supply a desired processing gas into the processing chamber;
a plasma generating unit configured to generate a plasma of the processing gas in the processing chamber;
an electrode configured to mount thereon the substrate in the processing chamber;
a RF power supply configured to output a RF power having a predetermined frequency used for controlling energy of ions incident onto the substrate on the electrode from the plasma; and
the automatic matching unit described in claim 12, connected between the RF power supply and the electrode.

* * * * *